US012593245B2

(12) United States Patent
Rangamgari et al.

(10) Patent No.: US 12,593,245 B2
(45) Date of Patent: Mar. 31, 2026

(54) ASYMMETRIC ENCODING SCHEMES

(71) Applicant: QUALCOMM Incorporated, San Diego, CA (US)

(72) Inventors: Vivek Kumar Rangamgari, Bangalore (IN); Ashutosh Vinod Agrawal, Bangalore (IN); Shashidhar Vummintala, Bangalore (IN)

(73) Assignee: QUALCOMM Incorporated, San Diego, CA (US)

( * ) Notice: Subject to any disclaimer, the term of this patent is extended or adjusted under 35 U.S.C. 154(b) by 126 days.

(21) Appl. No.: 18/393,199

(22) Filed: Dec. 21, 2023

(65) Prior Publication Data

US 2025/0212057 A1      Jun. 26, 2025

(51) Int. Cl.
*H03M 7/30* (2006.01)
*H04W 28/06* (2009.01)

(52) U.S. Cl.
CPC ......... *H04W 28/06* (2013.01); *H03M 7/6011* (2013.01); *H03M 7/70* (2013.01)

(58) Field of Classification Search
CPC .. H04W 28/06; H03M 7/6011; H03M 7/3055; H03M 7/70
USPC ........................................................ 709/238
See application file for complete search history.

(56) References Cited

U.S. PATENT DOCUMENTS

2016/0226513 A1*  8/2016  Liaghati ................... H03M 7/42
2016/0226514 A1*  8/2016  Liaghati .............. H03M 7/3046
2022/0116628 A1*  4/2022  Satavalekar ........... H04N 23/85

OTHER PUBLICATIONS

Google Scholar search history Nov. 14, 2025.*

* cited by examiner

*Primary Examiner* — Jude Jean Gilles
(74) *Attorney, Agent, or Firm* — Holland & Hart LLP

(57) ABSTRACT

Methods, systems, and devices for wireless communications are described. A first device may encode a first subset of bits of a total set of bits that are configured for encoding a fixed point complex data set that comprises a real portion and an imaginary portion, the first subset of bits indicating a quantity of redundant sign bits. The first device may encode a second subset of bits of the total set of bits, a first portion of the second subset of bits indicating the real portion and a second portion of the second subset of bits indicates the imaginary portion, where a first quantity of bits of the first portion is different from a second quantity of bits of the second portion based on the quantity of the first subset of bits being an odd integer value in accordance with the compression encoding scheme.

18 Claims, 13 Drawing Sheets

| Redundant Sign Bits 305 | 0 | 1 | 2 | 3 | 4 | 5 | 6 | 7 | 8 | 9 | 10 |
|---|---|---|---|---|---|---|---|---|---|---|---|
| Exponent Bits 310 | 4 | 4 | 4 | 4 | 2 | 3 | 3 | 4 | 4 | 4 | 4 |
| Bit 315-a | 1 | 1 | 1 | 1 | 0 | 0 | 0 | 1 | 1 | 1 | 1 |
| Bit 315-b | 0 | 0 | 0 | 0 | 0 | 1 | 1 | 1 | 1 | 1 | 1 |
| Bit 315-c | 0 | 0 | 1 | 1 | M | 0 | 1 | 0 | 0 | 1 | 1 |
| Bit 315-d | 0 | 1 | 0 | 1 | M | M | M | 0 | 1 | 0 | 1 |

Asymmetric Encoding
320

| Shift 325 | $S = 0$ | $S = 1$ | $S = 2$ | $S = 3$ | $S = 4$ | $S = 5$ | $S = 6$ | $S = 7$ |
|---|---|---|---|---|---|---|---|---|
| 0 | 2 | 4 | 4 | 4 | 4 | 4 | 4 | 4 |
| 1 | 3 | 2 | 4 | 4 | 4 | 4 | 4 | 4 |
| 2 | 3 | 3 | 2 | 4 | 4 | 4 | 4 | 4 |
| 3 | 4 | 3 | 3 | 2 | 4 | 4 | 4 | 4 |
| 4 | 4 | 4 | 3 | 3 | 2 | 4 | 4 | 4 |
| 5 | 4 | 4 | 4 | 3 | 3 | 2 | 4 | 4 |
| 6 | 4 | 4 | 4 | 4 | 3 | 3 | 2 | 4 |
| 7 | 4 | 4 | 4 | 4 | 4 | 3 | 3 | 2 |
| 8 | 4 | 4 | 4 | 4 | 4 | 4 | 3 | 3 |
| 9 | 4 | 4 | 4 | 4 | 4 | 4 | 4 | 3 |
| 10 | 4 | 4 | 4 | 4 | 4 | 4 | 4 | 4 |

Network
Entity

Transceiver

910

Antenna

915

Communications
Manager

920

Memory

Code

930

925

940

Processor

935

905

900

Figure 10:
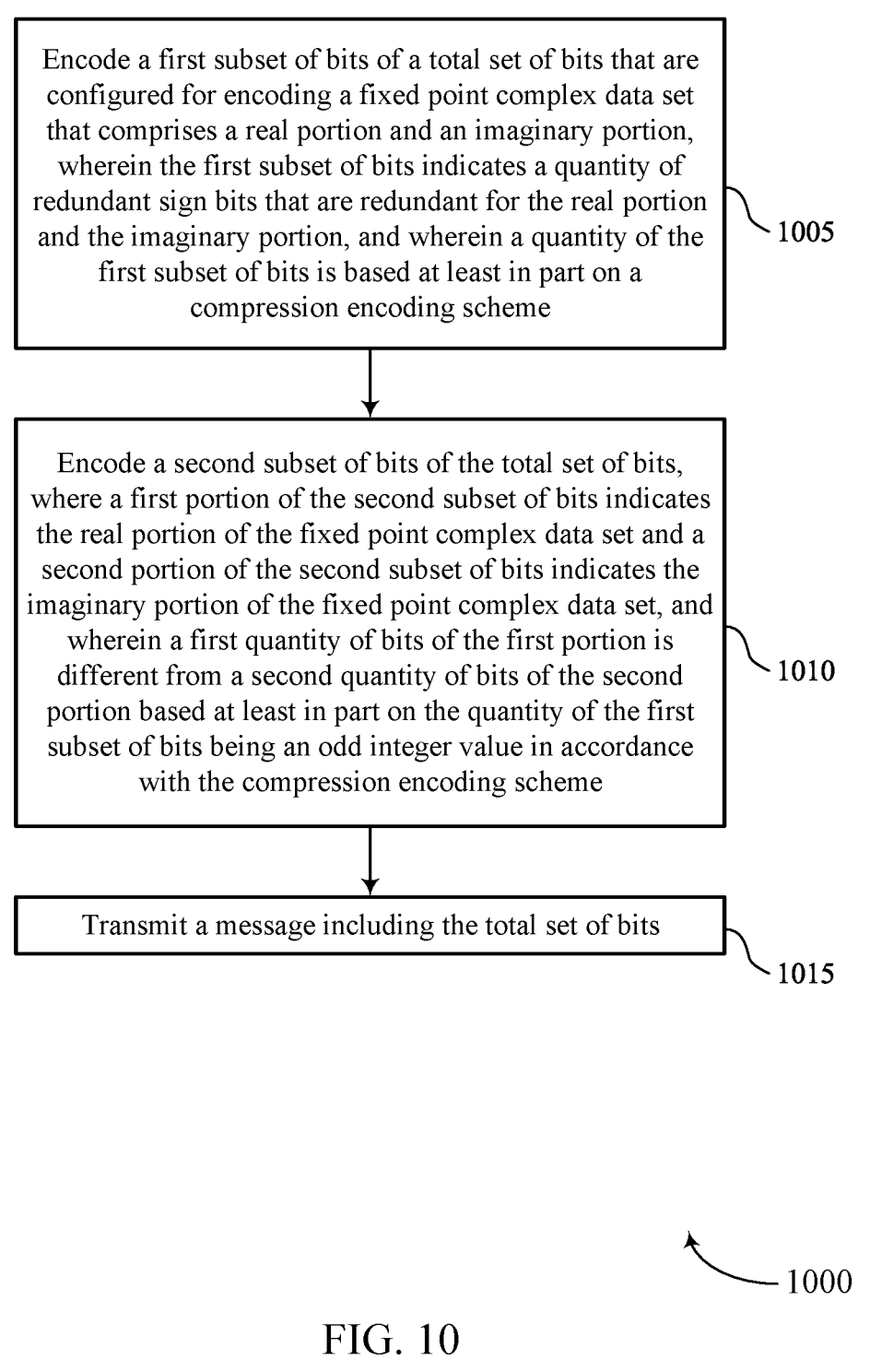

Encode a first subset of bits of a total set of bits that are
configured for encoding a fixed point complex data set
that comprises a real portion and an imaginary portion,
wherein the first subset of bits indicates a quantity of
redundant sign bits that are redundant for the real portion
and the imaginary portion, and wherein a quantity of the
first subset of bits is based at least in part on a
compression encoding scheme

1005

Encode a second subset of bits of the total set of bits,
where a first portion of the second subset of bits indicates
the real portion of the fixed point complex data set and a
second portion of the second subset of bits indicates the
imaginary portion of the fixed point complex data set, and
wherein a first quantity of bits of the first portion is
different from a second quantity of bits of the second
portion based at least in part on the quantity of the first
subset of bits being an odd integer value in accordance
with the compression encoding scheme

1010

Transmit a message including the total set of bits

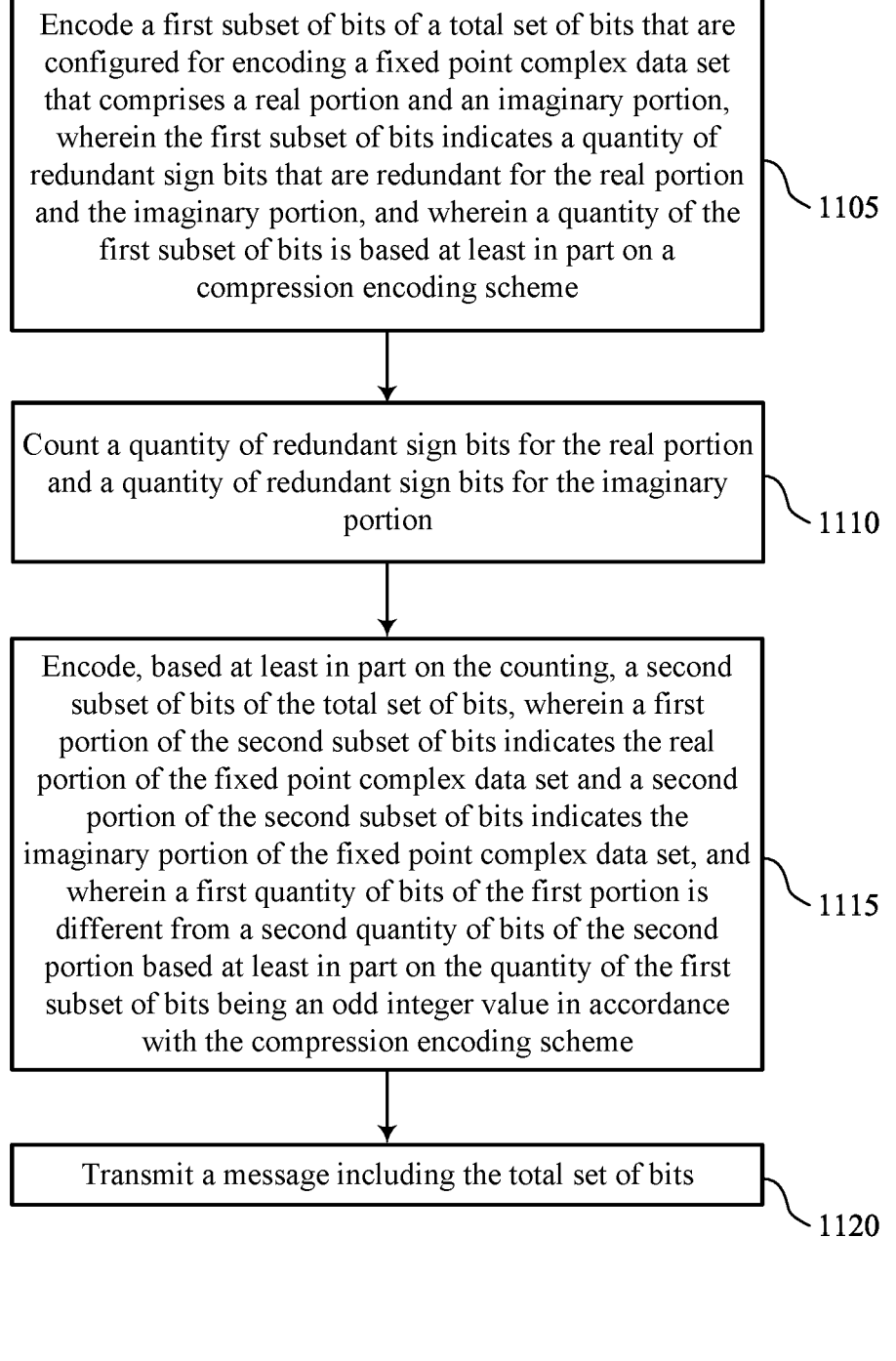

Encode a first subset of bits of a total set of bits that are configured for encoding a fixed point complex data set that comprises a real portion and an imaginary portion, wherein the first subset of bits indicates a quantity of redundant sign bits that are redundant for the real portion and the imaginary portion, and wherein a quantity of the first subset of bits is based at least in part on a compression encoding scheme

1105

Count a quantity of redundant sign bits for the real portion and a quantity of redundant sign bits for the imaginary portion

1110

Encode, based at least in part on the counting, a second subset of bits of the total set of bits, wherein a first portion of the second subset of bits indicates the real portion of the fixed point complex data set and a second portion of the second subset of bits indicates the imaginary portion of the fixed point complex data set, and wherein a first quantity of bits of the first portion is different from a second quantity of bits of the second portion based at least in part on the quantity of the first subset of bits being an odd integer value in accordance with the compression encoding scheme

1115

Transmit a message including the total set of bits

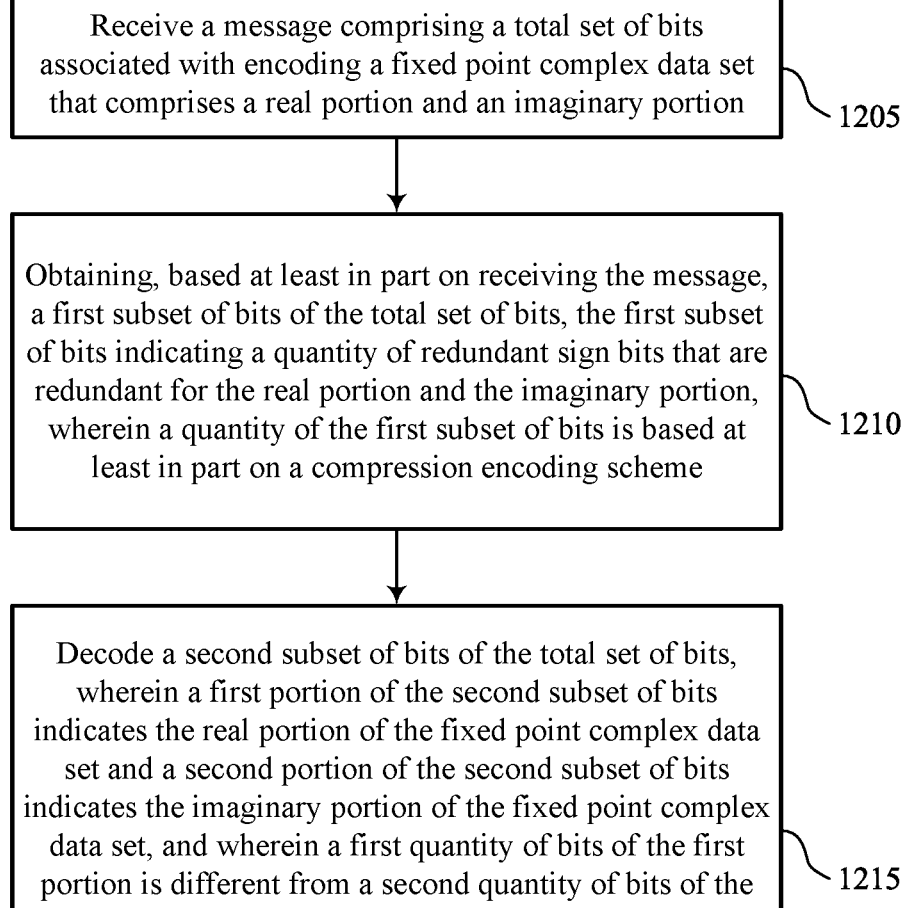

Receive a message comprising a total set of bits associated with encoding a fixed point complex data set that comprises a real portion and an imaginary portion

1205

Obtaining, based at least in part on receiving the message, a first subset of bits of the total set of bits, the first subset of bits indicating a quantity of redundant sign bits that are redundant for the real portion and the imaginary portion, wherein a quantity of the first subset of bits is based at least in part on a compression encoding scheme

1210

Decode a second subset of bits of the total set of bits, wherein a first portion of the second subset of bits indicates the real portion of the fixed point complex data set and a second portion of the second subset of bits indicates the imaginary portion of the fixed point complex data set, and wherein a first quantity of bits of the first portion is different from a second quantity of bits of the second portion based at least in part on the quantity of the first subset of bits being an odd integer value in accordance with the compression encoding scheme

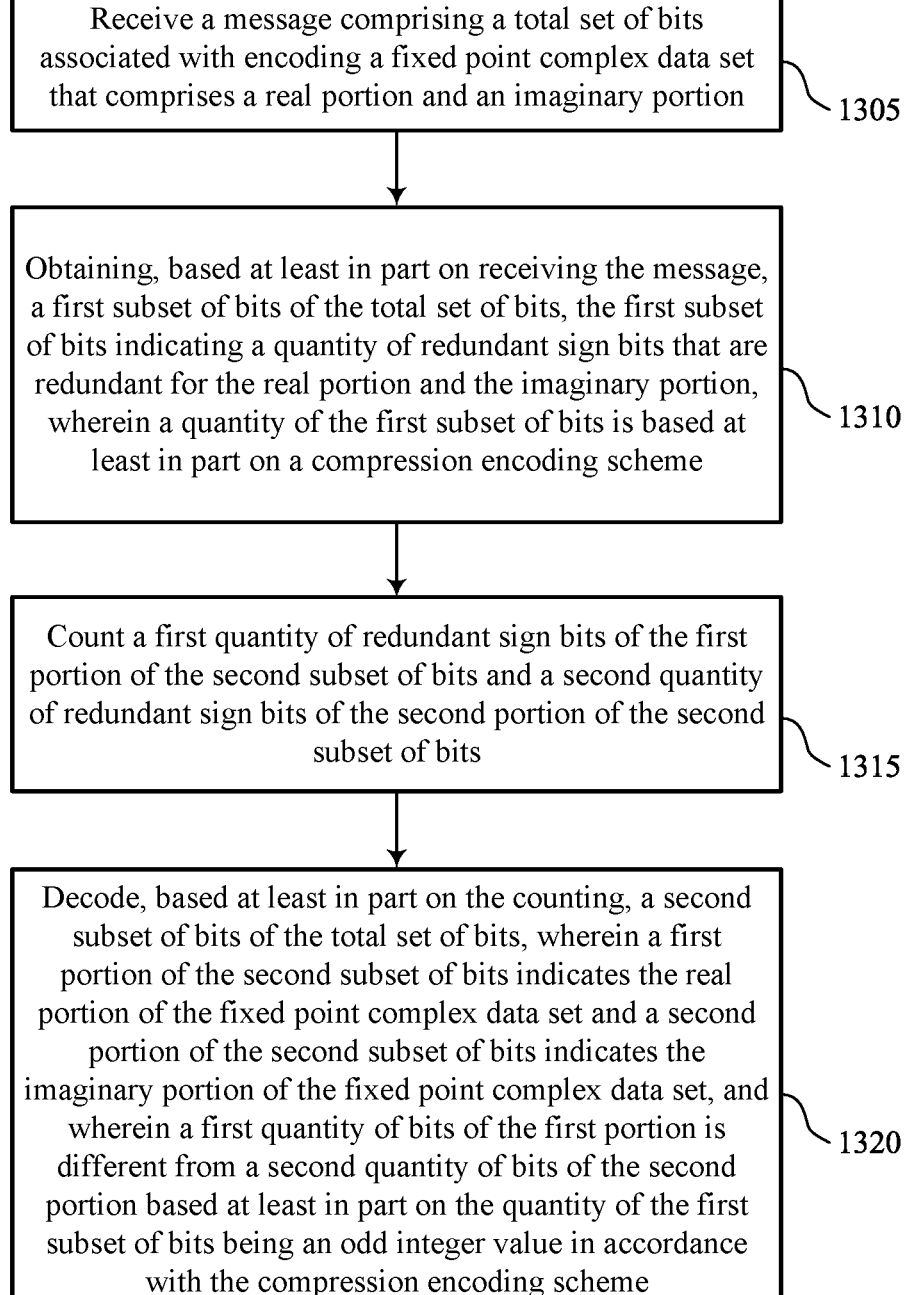

Receive a message comprising a total set of bits associated with encoding a fixed point complex data set that comprises a real portion and an imaginary portion

1305

Obtaining, based at least in part on receiving the message, a first subset of bits of the total set of bits, the first subset of bits indicating a quantity of redundant sign bits that are redundant for the real portion and the imaginary portion, wherein a quantity of the first subset of bits is based at least in part on a compression encoding scheme

1310

Count a first quantity of redundant sign bits of the first portion of the second subset of bits and a second quantity of redundant sign bits of the second portion of the second subset of bits

1315

Decode, based at least in part on the counting, a second subset of bits of the total set of bits, wherein a first portion of the second subset of bits indicates the real portion of the fixed point complex data set and a second portion of the second subset of bits indicates the imaginary portion of the fixed point complex data set, and wherein a first quantity of bits of the first portion is different from a second quantity of bits of the second portion based at least in part on the quantity of the first subset of bits being an odd integer value in accordance with the compression encoding scheme

ASYMMETRIC ENCODING SCHEMES

FIELD OF TECHNOLOGY

The following relates to wireless communications, including asymmetric encoding schemes.

BACKGROUND

Wireless communications systems are widely deployed to provide various types of communication content such as voice, video, packet data, messaging, broadcast, and so on. These systems may be capable of supporting communication with multiple users by sharing the available system resources (e.g., time, frequency, and power). Examples of such multiple-access systems include fourth generation (4G) systems such as Long Term Evolution (LTE) systems, LTE-Advanced (LTE-A) systems, or LTE-A Pro systems, and fifth generation (5G) systems which may be referred to as New Radio (NR) systems. These systems may employ technologies such as code division multiple access (CDMA), time division multiple access (TDMA), frequency division multiple access (FDMA), orthogonal FDMA (OFDMA), or discrete Fourier transform spread orthogonal frequency division multiplexing (DFT-S-OFDM).

A wireless multiple-access communications system may include one or more base stations, each supporting wireless communication for communication devices, which may be known as user equipment (UE). In some examples, data communicated between communication devices may be encoded using a compression encoding scheme.

SUMMARY

The described techniques relate to improved methods, systems, devices, and apparatuses that support asymmetric encoding schemes. For example, the described techniques provide for a device to encode fixed point complex data using an asymmetric encoding schemes. In some examples, an odd integer quantity of exponent bits may be used to encode a shift value of the fixed point complex data set, which may result in an odd integer quantity of bits left for encoding a real portion and an imaginary portion of the fixed point complex data set. This may result in asymmetric encoding, as the quantity of bits between the real portion and the imaginary portion may not be divided evenly. In some examples, one of the real portion and the imaginary portion may be encoded using more bits than the other of the real portion and the imaginary portion. In some cases, a device may be configured with a rule or a formula to determine which portion (e.g., the real portion or imaginary portion) is to be encoded with a larger quantity of bits. In some examples, the portion having the largest quantity of redundant (e.g., repeated) sign bits may be encoded using the larger quantity of bits.

A method for wireless communications by a transmitting device is described. The method may include encoding a first subset of bits of a total set of bits that are configured for encoding a fixed point complex data set that includes a real portion and an imaginary portion, where the first subset of bits indicates a quantity of redundant sign bits that are redundant for the real portion and the imaginary portion, and where a quantity of the first subset of bits is based on a compression encoding scheme, encoding a second subset of bits of the total set of bits, where a first portion of the second subset of bits indicates the real portion of the fixed point complex data set and a second portion of the second subset of bits indicates the imaginary portion of the fixed point complex data set, and where a first quantity of bits of the first portion is different from a second quantity of bits of the second portion based on the quantity of the first subset of bits being an odd integer value in accordance with the compression encoding scheme, and transmitting a message including the total set of bits.

A transmitting device for wireless communications is described. The transmitting device may include one or more memories storing processor executable code, and one or more processors coupled with the one or more memories. The one or more processors may individually or collectively operable to execute the code to cause the transmitting device to encode a first subset of bits of a total set of bits that are configured for encoding a fixed point complex data set that includes a real portion and an imaginary portion, where the first subset of bits indicates a quantity of redundant sign bits that are redundant for the real portion and the imaginary portion, and where a quantity of the first subset of bits is based on a compression encoding scheme, encode a second subset of bits of the total set of bits, where a first portion of the second subset of bits indicates the real portion of the fixed point complex data set and a second portion of the second subset of bits indicates the imaginary portion of the fixed point complex data set, and where a first quantity of bits of the first portion is different from a second quantity of bits of the second portion based on the quantity of the first subset of bits being an odd integer value in accordance with the compression encoding scheme, and transmit a message including the total set of bits.

Another transmitting device for wireless communications is described. The transmitting device may include means for encoding a first subset of bits of a total set of bits that are configured for encoding a fixed point complex data set that includes a real portion and an imaginary portion, where the first subset of bits indicates a quantity of redundant sign bits that are redundant for the real portion and the imaginary portion, and where a quantity of the first subset of bits is based on a compression encoding scheme, means for encoding a second subset of bits of the total set of bits, where a first portion of the second subset of bits indicates the real portion of the fixed point complex data set and a second portion of the second subset of bits indicates the imaginary portion of the fixed point complex data set, and where a first quantity of bits of the first portion is different from a second quantity of bits of the second portion based on the quantity of the first subset of bits being an odd integer value in accordance with the compression encoding scheme, and means for transmitting a message including the total set of bits.

A non-transitory computer-readable medium storing code for wireless communications is described. The code may include instructions executable by one or more processors (e.g., directly, indirectly, after pre-processing, without pre-processing, individually, collectively) to encode a first subset of bits of a total set of bits that are configured for encoding a fixed point complex data set that includes a real portion and an imaginary portion, where the first subset of bits indicates a quantity of redundant sign bits that are redundant for the real portion and the imaginary portion, and where a quantity of the first subset of bits is based on a compression encoding scheme, encode a second subset of bits of the total set of bits, where a first portion of the second subset of bits indicates the real portion of the fixed point complex data set and a second portion of the second subset of bits indicates the imaginary portion of the fixed point complex data set, and where a first quantity of bits of the first portion is different from a second quantity of bits of the second portion based on the quantity of the first subset of bits being an odd integer value in accordance with the compression encoding scheme, and transmit a message including the total set of bits.

In some examples of the method, transmitting devices, and non-transitory computer-readable medium described herein, the quantity of the first portion of the second subset of bits associated with the real portion may be larger than the quantity of the second portion of the second subset of bits associated with the imaginary portion.

In some examples of the method, transmitting devices, and non-transitory computer-readable medium described herein, the quantity of the first portion of the second subset of bits associated with the imaginary portion may be larger than the quantity of the second portion of the second subset of bits associated with the real portion.

Some examples of the method, transmitting devices, and non-transitory computer-readable medium described herein may further include operations, features, means, or instructions for counting a quantity of redundant sign bits for the real portion and a quantity of redundant sign bits for the imaginary portion, where encoding the second subset of bits may be based on the counting.

Some examples of the method, transmitting devices, and non-transitory computer-readable medium described herein may further include operations, features, means, or instructions for encoding the first portion of the second subset of bits having the first quantity of bits, where the first quantity of bits of the first portion may be larger than the second quantity of bits of the second portion based on the quantity of redundant sign bits for the real portion being larger than the quantity of redundant sign bits for the imaginary portion.

In some examples of the method, transmitting devices, and non-transitory computer-readable medium described herein, the total set of bits includes 16 bits, the quantity of the first subset of bits includes three bits, the first quantity of bits includes seven bits, and the second quantity of bits includes six bits.

Some examples of the method, transmitting devices, and non-transitory computer-readable medium described herein may further include operations, features, means, or instructions for encoding the second portion of the second subset of bits having the second quantity of bits, where the second quantity of bits of the second portion may be larger than the first quantity of bits of the first portion based on the quantity of redundant sign bits for the imaginary portion being larger than the quantity of redundant sign bits for the real portion.

In some examples of the method, transmitting devices, and non-transitory computer-readable medium described herein, the total set of bits includes 16 bits, the quantity of the first subset of bits includes three bits, the first quantity of bits includes six bits, and the second quantity of bits includes seven bits.

Some examples of the method, transmitting devices, and non-transitory computer-readable medium described herein may further include operations, features, means, or instructions for calculating the first quantity of bits and the second quantity of bits based on a quantity of the total set of bits, the quantity of the first subset of bits, and a difference between the quantity of redundant sign bits for the real portion and the quantity of redundant sign bits for the imaginary portion, where encoding the second subset of bits may be based on the calculating of the first quantity of bits and the second quantity of bits.

Some examples of the method, transmitting devices, and non-transitory computer-readable medium described herein may further include operations, features, means, or instructions for performing a flip-left-to-right operation on the second portion of the second subset of bits, where encoding the second subset of bits may be based on performing the flip-left-to-right operation.

Some examples of the method, transmitting devices, and non-transitory computer-readable medium described herein may further include operations, features, means, or instructions for encoding an additional first subset of bits of a second total set of bits associated with a second fixed point complex data set including a second real portion and a second imaginary portion, where the additional first subset of bits indicates an additional quantity of redundant sign bits that may be redundant for the second real portion and the second imaginary portion, and where a quantity of the additional first subset of bits may be based on the compression encoding scheme and encoding an additional second subset of bits of the second total set of bits, where a first portion of the additional second subset of bits indicates the second real portion and a second portion of the additional second subset of bits indicates the second imaginary portion, and where an additional first quantity of bits of the first portion of the additional second subset of bits may be the same as an additional second quantity of bits of the second portion of the additional second subset of bits based on the quantity of the additional first subset of bits being an even integer value in accordance with the compression encoding scheme.

A method for wireless communications by a receiving device is described. The method may include receiving a message including a total set of bits associated with encoding a fixed point complex data set that includes a real portion and an imaginary portion, obtaining, based on receiving the message, a first subset of bits of the total set of bits, the first subset of bits indicating a quantity of redundant sign bits that are redundant for the real portion and the imaginary portion, where a quantity of the first subset of bits is based on a compression encoding scheme, and decoding a second subset of bits of the total set of bits, where a first portion of the second subset of bits indicates the real portion of the fixed point complex data set and a second portion of the second subset of bits indicates the imaginary portion of the fixed point complex data set, and where a first quantity of bits of the first portion is different from a second quantity of bits of the second portion based on the quantity of the first subset of bits being an odd integer value in accordance with the compression encoding scheme.

A receiving device for wireless communications is described. The receiving device may include one or more memories storing processor executable code, and one or more processors coupled with the one or more memories. The one or more processors may individually or collectively operable to execute the code to cause the receiving device to receive a message including a total set of bits associated with encoding a fixed point complex data set that includes a real portion and an imaginary portion, obtain, based on receiving the message, a first subset of bits of the total set of bits, the first subset of bits indicating a quantity of redundant sign bits that are redundant for the real portion and the imaginary portion, where a quantity of the first subset of bits is based on a compression encoding scheme, and decode a second subset of bits of the total set of bits, where a first portion of the second subset of bits indicates the real portion of the fixed point complex data set and a second portion of the second subset of bits indicates the imaginary portion of the fixed point complex data set, and where a first quantity of bits of the first portion is different from a second quantity of bits of the second portion based on the quantity of the first subset of bits being an odd integer value in accordance with the compression encoding scheme.

Another receiving device for wireless communications is described. The receiving device may include means for receiving a message including a total set of bits associated with encoding a fixed point complex data set that includes a real portion and an imaginary portion, means for obtaining, based on receiving the message, a first subset of bits of the total set of bits, the first subset of bits indicating a quantity of redundant sign bits that are redundant for the real portion and the imaginary portion, where a quantity of the first subset of bits is based on a compression encoding scheme, and means for decoding a second subset of bits of the total set of bits, where a first portion of the second subset of bits indicates the real portion of the fixed point complex data set and a second portion of the second subset of bits indicates the imaginary portion of the fixed point complex data set, and where a first quantity of bits of the first portion is different from a second quantity of bits of the second portion based on the quantity of the first subset of bits being an odd integer value in accordance with the compression encoding scheme.

A non-transitory computer-readable medium storing code for wireless communications is described. The code may include instructions executable by one or more processors (e.g., directly, indirectly, after pre-processing, without pre-processing, individually, collectively) to receive a message including a total set of bits associated with encoding a fixed point complex data set that includes a real portion and an imaginary portion, obtain, based on receiving the message, a first subset of bits of the total set of bits, the first subset of bits indicating a quantity of redundant sign bits that are redundant for the real portion and the imaginary portion, where a quantity of the first subset of bits is based on a compression encoding scheme, and decode a second subset of bits of the total set of bits, where a first portion of the second subset of bits indicates the real portion of the fixed point complex data set and a second portion of the second subset of bits indicates the imaginary portion of the fixed point complex data set, and where a first quantity of bits of the first portion is different from a second quantity of bits of the second portion based on the quantity of the first subset of bits being an odd integer value in accordance with the compression encoding scheme.

In some examples of the method, receiving devices, and non-transitory computer-readable medium described herein, the quantity of the first portion of the second subset of bits associated with the real portion may be larger than the quantity of the second portion of the second subset of bits associated with the imaginary portion.

In some examples of the method, receiving devices, and non-transitory computer-readable medium described herein, the quantity of the first portion of the second subset of bits associated with the imaginary portion may be larger than the quantity of the second portion of the second subset of bits associated with the real portion.

Some examples of the method, receiving devices, and non-transitory computer-readable medium described herein may further include operations, features, means, or instructions for counting a first quantity of redundant sign bits of the first portion of the second subset of bits and a second quantity of redundant sign bits of the second portion of the second subset of bits, where decoding the second subset of bits may be based on the counting.

In some examples of the method, receiving devices, and non-transitory computer-readable medium described herein, the first quantity of redundant sign bits may be counted sequentially beginning from a starting bit of the second subset of bits and the second quantity of redundant sign bits may be counted sequentially beginning from a last bit of the second subset of bits based on a flip-left-to-right operation performed on the second quantity of redundant sign bits.

Some examples of the method, receiving devices, and non-transitory computer-readable medium described herein may further include operations, features, means, or instructions for determining that the first quantity of bits of the first portion may be larger than the second quantity of bits of the second portion based on the first quantity of redundant sign bits being larger than the second quantity of redundant bits, where the decoding may be based on the determining. In some examples of the method, receiving devices, and non-transitory computer-readable medium described herein, the total set of bits includes 16 bits, the quantity of the first subset of bits includes three bits, the first quantity of bits includes seven bits, and the second quantity of bits includes six bits.

Some examples of the method, receiving devices, and non-transitory computer-readable medium described herein may further include operations, features, means, or instructions for determining that the second quantity of bits of the second portion may be larger than the first quantity of bits of the first portion based on the second quantity of redundant sign bits being larger than the first quantity of redundant bits, where the decoding may be based on the determining. In some examples of the method, receiving devices, and non-transitory computer-readable medium described herein, the total set of bits includes 16 bits, the quantity of the first subset of bits includes three bits, the first quantity of bits includes six bits, and the second quantity of bits includes seven bits.

BRIEF DESCRIPTION OF THE DRAWINGS

FIG. 3A shows an example of an encoding scheme that supports asymmetric encoding schemes in accordance with one or more aspects of the present disclosure.

FIG. 3B shows an example of a shift diagram that supports asymmetric encoding schemes in accordance with one or more aspects of the present disclosure.

FIGS. 10 through 13 show flowcharts illustrating methods that support asymmetric encoding schemes in accordance with one or more aspects of the present disclosure.

DETAILED DESCRIPTION

Figure 1:
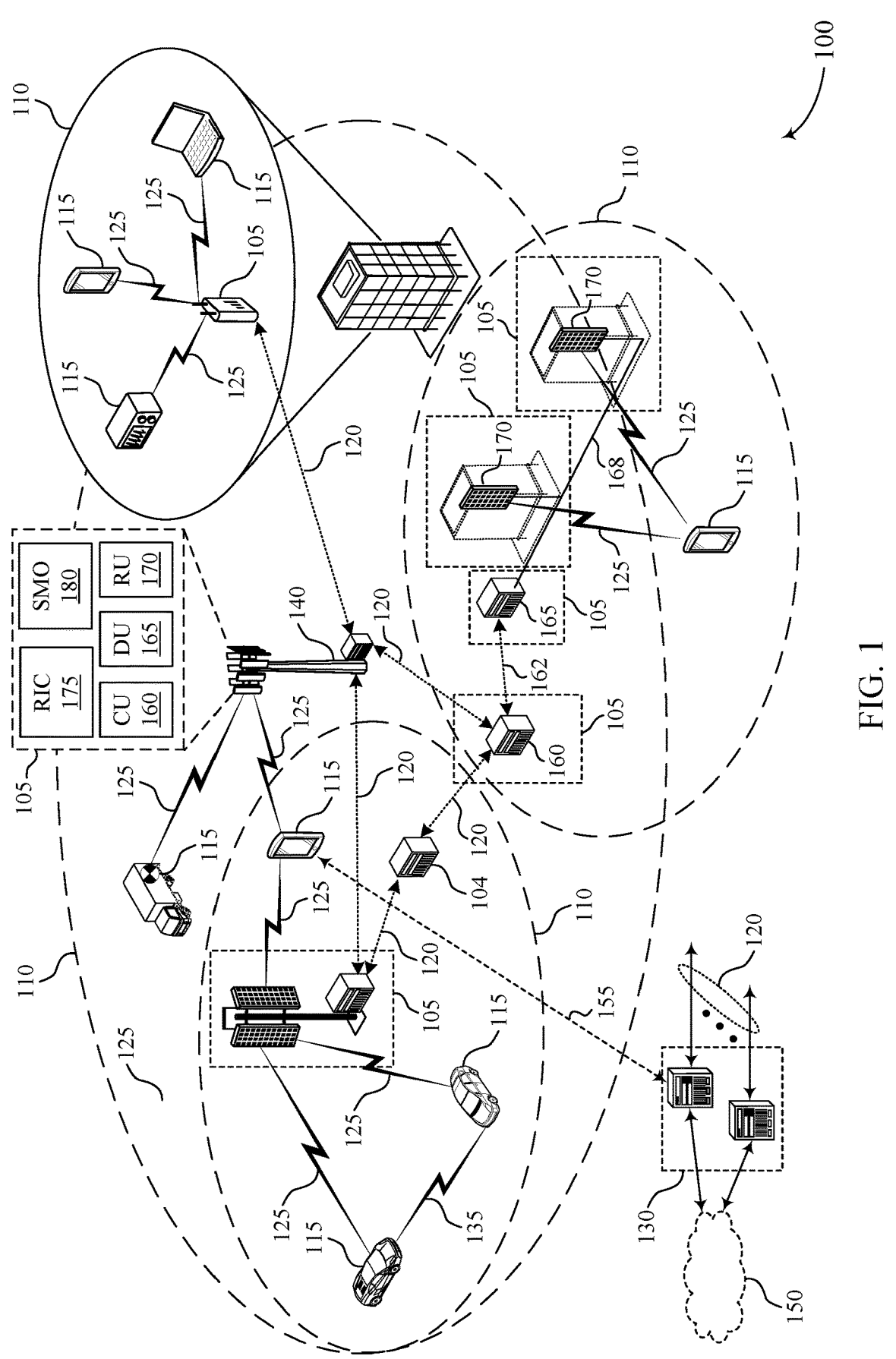
FIG. 1 shows an example of a wireless communications system that supports asymmetric encoding schemes in accordance with one or more aspects of the present disclosure.

In some systems, complex data may be encoded using an encoding scheme to represent the complex data in a digital format (e.g., using one or more bits). In some examples, high precision complex fixed length (HPCFL) encoding may be used to encode complex data in a fixed-point form, which may serve to compress the data. For example, the fixed point complex data may be stored in an exponent-mantissa form, where exponent bits encode a quantity of sign bits that are redundant (e.g., shared) between a real portion and an imaginary portion of the fixed point complex data, and mantissa bits encode a quantity of bits following the redundant sign bits for each of the real portion and the imaginary portion.

As HPCFL is a fixed length encoding scheme, a portion of a fixed bit length may be used for the exponent bits, and the remaining bits may be divided between the real portion and the imaginary portion of the complex data. For example, in 16HPCFL encoding, 16 bits may be used to encode the fixed point complex data. The exponent bits may use a quantity of four bits or two bits, and the remaining bits may be used to encode the real and imaginary portions (e.g., using six bits each for four exponent bits, or seven bits each for two exponent bits). To ensure the real portion and the imaginary portions are encoded with a same quantity of bits, the quantity of exponent bits may be an even integer value. However, this may limit the possible shift values (e.g., the quantity of redundant sign bits) that may be encoded. For example, in 16HPCFL, the exponent bits may encode a shift value between zero and nine. To encode a larger shift value, an encoding scheme with a larger quantity of bits may be used (e.g., 20HPCFL), but this may increase power consumption and overhead for transmissions due to the larger quantity of bits. As such, techniques for supporting a larger quantity of shift values without increasing the total quantity of bits may be desired.

In accordance with techniques as described herein, an asymmetric encoding scheme may be used to encode fixed point complex data. For example, an odd integer quantity of exponent bits may be used to encode a shift value of the fixed point complex data. As such, an odd quantity of bits may remain to encoding of a real portion and an imaginary portion of the fixed point complex data, resulting in asymmetric encoding. For example, in 16HPCFL, three bits may be used for the exponent bits, leaving 13 bits for the real portion and the imaginary portion. As such, one of the real portion or the imaginary portion may be encoded using 6 bits, and the other may be encoded using 7 bits. In some examples, a transmitting device may be configured with a rule for determining which portion to encode with a larger quantity of bits. In some cases, the real portion or the imaginary portion may always be encoded with the larger quantity of bits. In some cases, the transmitting device may determine whether the real portion or the imaginary portion contains a largest quantity of redundant (e.g., repeated) sign bits, and the transmitting device may encode the portion with the largest quantity of redundant sign bits using the larger quantity of bits. A receiving device may also be configured to determine which portion (e.g., the real portion or the imaginary portion) is encoded with the larger quantity of bits, allowing the receiving device to decode the complex data.

Accordingly, by encoding the fixed point complex data using an asymmetric encoding scheme, a larger quantity of shift values may be supported without increasing the total quantity of bits of the encoding scheme. By supporting asymmetric encoding schemes, devise may experience a higher signal-to-quantization-noise ratio (SQNR) for a larger range of input signal power values relative to non-asymmetric encoding techniques. Due to the higher SQNR for the larger range of input signal power values, these techniques may further achieve a more robust throughput performance when there is a relatively high variance in the input signal power. As such, communication performance between devices may be improved without increasing the total quantity of bits used for encoding of a signal.

Aspects of the disclosure are initially described in the context of wireless communications systems. Aspects of the disclosure are additionally illustrated with respect to encoding schemes, shift diagrams, and process flows. Aspects of the disclosure are further illustrated by and described with reference to apparatus diagrams, system diagrams, and flowcharts that relate to asymmetric encoding schemes.

FIG. 1 shows an example of a wireless communications system 100 that supports asymmetric encoding schemes in accordance with one or more aspects of the present disclosure. The wireless communications system 100 may include one or more network entities 105, one or more UEs 115, and a core network 130. In some examples, the wireless communications system 100 may be a Long Term Evolution (LTE) network, an LTE-Advanced (LTE-A) network, an LTE-A Pro network, a New Radio (NR) network, or a network operating in accordance with other systems and radio technologies, including future systems and radio technologies not explicitly mentioned herein.

The network entities 105 may be dispersed throughout a geographic area to form the wireless communications system 100 and may include devices in different forms or having different capabilities. In various examples, a network entity 105 may be referred to as a network element, a mobility element, a radio access network (RAN) node, or network equipment, among other nomenclature. In some examples, network entities 105 and UEs 115 may wirelessly communicate via one or more communication links 125 (e.g., a radio frequency (RF) access link). For example, a network entity 105 may support a coverage area 110 (e.g., a geographic coverage area) over which the UEs 115 and the network entity 105 may establish one or more communication links 125. The coverage area 110 may be an example of a geographic area over which a network entity 105 and a UE 115 may support the communication of signals according to one or more radio access technologies (RATs).

The UEs 115 may be dispersed throughout a coverage area 110 of the wireless communications system 100, and each UE 115 may be stationary, or mobile, or both at different times. The UEs 115 may be devices in different forms or having different capabilities. Some example UEs 115 are illustrated in FIG. 1. The UEs 115 described herein may be capable of supporting communications with various types of devices, such as other UEs 115 or network entities 105, as shown in FIG. 1.

As described herein, a node of the wireless communications system 100, which may be referred to as a network node, or a wireless node, may be a network entity 105 (e.g., any network entity described herein), a UE 115 (e.g., any UE described herein), a network controller, an apparatus, a device, a computing system, one or more components, or another suitable processing entity configured to perform any of the techniques described herein. For example, a node may be a UE 115. As another example, a node may be a network entity 105. As another example, a first node may be configured to communicate with a second node or a third node. In one aspect of this example, the first node may be a UE 115, the second node may be a network entity 105, and the third node may be a UE 115. In another aspect of this example, the first node may be a UE 115, the second node may be a network entity 105, and the third node may be a network entity 105. In yet other aspects of this example, the first, second, and third nodes may be different relative to these examples. Similarly, reference to a UE 115, network entity 105, apparatus, device, computing system, or the like may include disclosure of the UE 115, network entity 105, apparatus, device, computing system, or the like being a node. For example, disclosure that a UE 115 is configured to receive information from a network entity 105 also discloses that a first node is configured to receive information from a second node.

In some examples, network entities 105 may communicate with the core network 130, or with one another, or both. For example, network entities 105 may communicate with the core network 130 via one or more backhaul communication links 120 (e.g., in accordance with an S1, N2, N3, or other interface protocol). In some examples, network entities 105 may communicate with one another via a backhaul communication link 120 (e.g., in accordance with an X2, Xn, or other interface protocol) either directly (e.g., directly between network entities 105) or indirectly (e.g., via a core network 130). In some examples, network entities 105 may communicate with one another via a midhaul communication link 162 (e.g., in accordance with a midhaul interface protocol) or a fronthaul communication link 168 (e.g., in accordance with a fronthaul interface protocol), or any combination thereof. The backhaul communication links 120, midhaul communication links 162, or fronthaul communication links 168 may be or include one or more wired links (e.g., an electrical link, an optical fiber link), one or more wireless links (e.g., a radio link, a wireless optical link), among other examples or various combinations thereof. A UE 115 may communicate with the core network 130 via a communication link 155.

One or more of the network entities 105 described herein may include or may be referred to as a base station 140 (e.g., a base transceiver station, a radio base station, an NR base station, an access point, a radio transceiver, a NodeB, an eNodeB (eNB), a next-generation NodeB or a giga-NodeB (either of which may be referred to as a gNB), a 5G NB, a next-generation eNB (ng-eNB), a Home NodeB, a Home eNodeB, or other suitable terminology). In some examples, a network entity 105 (e.g., a base station 140) may be implemented in an aggregated (e.g., monolithic, standalone) base station architecture, which may be configured to utilize a protocol stack that is physically or logically integrated within a single network entity 105 (e.g., a single RAN node, such as a base station 140).

In some examples, a network entity 105 may be implemented in a disaggregated architecture (e.g., a disaggregated base station architecture, a disaggregated RAN architecture), which may be configured to utilize a protocol stack that is physically or logically distributed among two or more network entities 105, such as an integrated access backhaul (IAB) network, an open RAN (O-RAN) (e.g., a network configuration sponsored by the O-RAN Alliance), or a virtualized RAN (vRAN) (e.g., a cloud RAN (C-RAN)). For example, a network entity 105 may include one or more of a central unit (CU) 160, a distributed unit (DU) 165, a radio unit (RU) 170, a RAN Intelligent Controller (RIC) 175 (e.g., a Near-Real Time RIC (Near-RT RIC), a Non-Real Time RIC (Non-RT RIC)), a Service Management and Orchestration (SMO) 180 system, or any combination thereof. An RU 170 may also be referred to as a radio head, a smart radio head, a remote radio head (RRH), a remote radio unit (RRU), or a transmission reception point (TRP). One or more components of the network entities 105 in a disaggregated RAN architecture may be co-located, or one or more components of the network entities 105 may be located in distributed locations (e.g., separate physical locations). In some examples, one or more network entities 105 of a disaggregated RAN architecture may be implemented as virtual units (e.g., a virtual CU (VCU), a virtual DU (VDU), a virtual RU (VRU)).

The split of functionality between a CU 160, a DU 165, and an RU 170 is flexible and may support different functionalities depending on which functions (e.g., network layer functions, protocol layer functions, baseband functions, RF functions, and any combinations thereof) are performed at a CU 160, a DU 165, or an RU 170. For example, a functional split of a protocol stack may be employed between a CU 160 and a DU 165 such that the CU 160 may support one or more layers of the protocol stack and the DU 165 may support one or more different layers of the protocol stack. In some examples, the CU 160 may host upper protocol layer (e.g., layer 3 (L3), layer 2 (L2)) functionality and signaling (e.g., Radio Resource Control (RRC), service data adaption protocol (SDAP), Packet Data Convergence Protocol (PDCP)). The CU 160 may be connected to one or more DUs 165 or RUs 170, and the one or more DUs 165 or RUs 170 may host lower protocol layers, such as layer 1 (L1) (e.g., physical (PHY) layer) or L2 (e.g., radio link control (RLC) layer, medium access control (MAC) layer) functionality and signaling, and may each be at least partially controlled by the CU 160. Additionally, or alternatively, a functional split of the protocol stack may be employed between a DU 165 and an RU 170 such that the DU 165 may support one or more layers of the protocol stack and the RU 170 may support one or more different layers of the protocol stack. The DU 165 may support one or multiple different cells (e.g., via one or more RUs 170). In some cases, a functional split between a CU 160 and a DU 165, or between a DU 165 and an RU 170 may be within a protocol layer (e.g., some functions for a protocol layer may be performed by one of a CU 160, a DU 165, or an RU 170, while other functions of the protocol layer are performed by a different one of the CU 160, the DU 165, or the RU 170). A CU 160 may be functionally split further into CU control plane (CU-CP) and CU user plane (CU-UP) functions. A CU 160 may be connected to one or more DUs 165 via a midhaul communication link 162 (e.g., F1, F1-c, F1-u), and a DU 165 may be connected to one or more RUs 170 via a fronthaul communication link 168 (e.g., open fronthaul (FH) interface). In some examples, a midhaul communication link 162 or a fronthaul communication link 168 may be implemented in accordance with an interface (e.g., a channel) between layers of a protocol stack supported by respective network entities 105 that are in communication via such communication links.

In wireless communications systems (e.g., wireless communications system 100), infrastructure and spectral resources for radio access may support wireless backhaul link capabilities to supplement wired backhaul connections, providing an IAB network architecture (e.g., to a core network 130). In some cases, in an IAB network, one or more network entities 105 (e.g., IAB nodes 104) may be partially controlled by each other. One or more IAB nodes 104 may be referred to as a donor entity or an IAB donor. One or more DUs 165 or one or more RUs 170 may be partially controlled by one or more CUs 160 associated with a donor network entity 105 (e.g., a donor base station 140). The one or more donor network entities 105 (e.g., IAB donors) may be in communication with one or more additional network entities 105 (e.g., IAB nodes 104) via supported access and backhaul links (e.g., backhaul communication links 120). IAB nodes 104 may include an IAB mobile termination (IAB-MT) controlled (e.g., scheduled) by DUs 165 of a coupled IAB donor. An IAB-MT may include an independent set of antennas for relay of communications with UEs 115, or may share the same antennas (e.g., of an RU 170) of an IAB node 104 used for access via the DU 165 of the IAB node 104 (e.g., referred to as virtual IAB-MT (vIAB-MT)). In some examples, the IAB nodes 104 may include DUs 165 that support communication links with additional entities (e.g., IAB nodes 104, UEs 115) within the relay chain or configuration of the access network (e.g., downstream). In such cases, one or more components of the disaggregated RAN architecture (e.g., one or more IAB nodes 104 or components of IAB nodes 104) may be configured to operate according to the techniques described herein.

In the case of the techniques described herein applied in the context of a disaggregated RAN architecture, one or more components of the disaggregated RAN architecture may be configured to support asymmetric encoding schemes as described herein. For example, some operations described as being performed by a UE 115 or a network entity 105 (e.g., a base station 140) may additionally, or alternatively, be performed by one or more components of the disaggregated RAN architecture (e.g., IAB nodes 104, DUs 165, CUs 160, RUs 170, RIC 175, SMO 180).

A UE 115 may include or may be referred to as a mobile device, a wireless device, a remote device, a handheld device, or a subscriber device, or some other suitable terminology, where the "device" may also be referred to as a unit, a station, a terminal, or a client, among other examples. A UE 115 may also include or may be referred to as a personal electronic device such as a cellular phone, a personal digital assistant (PDA), a multimedia/entertainment device (e.g., a radio, a MP3 player, or a video device), a camera, a gaming device, a navigation/positioning device (e.g., GNSS (global navigation satellite system) devices based on, for example, GPS (global positioning system), Beidou, GLONASS, or Galileo, or a terrestrial-based device), a tablet computer, a laptop computer, a netbook, a smartbook, a personal computer, a smart device, a wearable device (e.g., a smart watch, smart clothing, smart glasses, virtual reality goggles, a smart wristband, smart jewelry (e.g., a smart ring, a smart bracelet)), a robot/robotic device, a vehicle, a vehicular device, a meter (e.g., parking meter, electric meter, gas meter, water meter), a monitor, a gas pump, an appliance (e.g., kitchen appliance, washing machine, dryer), a location tag, a medical/healthcare device, an implant, a sensor/actuator, a display, or any other suitable device configured to communicate via a wireless or wired medium, a personal computer, or any other suitable device configured to communicate via a wireless or wired medium. In some examples, a UE 115 may include or be referred to as a wireless local loop (WLL) station, an Internet of Things (IoT) device, an Internet of Everything (IoE) device, or a machine type communications (MTC) device, among other examples, which may be implemented in various objects such as appliances, or vehicles, meters, among other examples.

The UEs 115 described herein may be able to communicate with various types of devices, such as other UEs 115 that may sometimes act as relays as well as the network entities 105 and the network equipment including macro eNBs or gNBs, small cell eNBs or gNBs, or relay base stations, among other examples, as shown in FIG. 1.

The UEs 115 and the network entities 105 may wirelessly communicate with one another via one or more communication links 125 (e.g., an access link) using resources associated with one or more carriers. The term "carrier" may refer to a set of RF spectrum resources having a defined physical layer structure for supporting the communication links 125. For example, a carrier used for a communication link 125 may include a portion of a RF spectrum band (e.g., a bandwidth part (BWP)) that is operated according to one or more physical layer channels for a given radio access technology (e.g., LTE, LTE-A, LTE-A Pro, NR). Each physical layer channel may carry acquisition signaling (e.g., synchronization signals, system information), control signaling that coordinates operation for the carrier, user data, or other signaling. The wireless communications system 100 may support communication with a UE 115 using carrier aggregation or multi-carrier operation. A UE 115 may be configured with multiple downlink component carriers and one or more uplink component carriers according to a carrier aggregation configuration. Carrier aggregation may be used with both frequency division duplexing (FDD) and time division duplexing (TDD) component carriers. Communication between a network entity 105 and other devices may refer to communication between the devices and any portion (e.g., entity, sub-entity) of a network entity 105. For example, the terms "transmitting," "receiving," or "communicating," when referring to a network entity 105, may refer to any portion of a network entity 105 (e.g., a base station 140, a CU 160, a DU 165, a RU 170) of a RAN communicating with another device (e.g., directly or via one or more other network entities 105).

Signal waveforms transmitted via a carrier may be made up of multiple subcarriers (e.g., using multi-carrier modulation (MCM) techniques such as orthogonal frequency division multiplexing (OFDM) or discrete Fourier transform spread OFDM (DFT-S-OFDM)). In a system employing MCM techniques, a resource element may refer to resources of one symbol period (e.g., a duration of one modulation symbol) and one subcarrier, in which case the symbol period and subcarrier spacing may be inversely related. The quantity of bits carried by each resource element may depend on the modulation scheme (e.g., the order of the modulation scheme, the coding rate of the modulation scheme, or both), such that a relatively higher quantity of resource elements (e.g., in a transmission duration) and a relatively higher order of a modulation scheme may correspond to a relatively higher rate of communication. A wireless communications resource may refer to a combination of an RF spectrum resource, a time resource, and a spatial resource (e.g., a spatial layer, a beam), and the use of multiple spatial resources may increase the data rate or data integrity for communications with a UE 115.

The time intervals for the network entities 105 or the UEs 115 may be expressed in multiples of a basic time unit which may, for example, refer to a sampling period of $T_s = 1/(\Delta f_{max} \cdot N_f)$ seconds, for which $\Delta f_{max}$ may represent a supported subcarrier spacing, and $N_f$ may represent a supported discrete Fourier transform (DFT) size. Time intervals of a communications resource may be organized according to radio frames each having a specified duration (e.g., 10 milliseconds (ms)). Each radio frame may be identified by a system frame number (SFN) (e.g., ranging from 0 to 1023).

Each frame may include multiple consecutively-numbered subframes or slots, and each subframe or slot may have the same duration. In some examples, a frame may be divided (e.g., in the time domain) into subframes, and each subframe may be further divided into a quantity of slots. Alternatively, each frame may include a variable quantity of slots, and the quantity of slots may depend on subcarrier spacing. Each slot may include a quantity of symbol periods (e.g., depending on the length of the cyclic prefix prepended to each symbol period). In some wireless communications systems 100, a slot may further be divided into multiple mini-slots associated with one or more symbols. Excluding the cyclic prefix, each symbol period may be associated with one or more (e.g., $N_f$) sampling periods. The duration of a symbol period may depend on the subcarrier spacing or frequency band of operation.

A subframe, a slot, a mini-slot, or a symbol may be the smallest scheduling unit (e.g., in the time domain) of the wireless communications system 100 and may be referred to as a transmission time interval (TTI). In some examples, the TTI duration (e.g., a quantity of symbol periods in a TTI) may be variable. Additionally, or alternatively, the smallest scheduling unit of the wireless communications system 100 may be dynamically selected (e.g., in bursts of shortened TTIs (STTIs)).

Physical channels may be multiplexed for communication using a carrier according to various techniques. A physical control channel and a physical data channel may be multiplexed for signaling via a downlink carrier, for example, using one or more of time division multiplexing (TDM) techniques, frequency division multiplexing (FDM) techniques, or hybrid TDM-FDM techniques. A control region (e.g., a control resource set (CORESET)) for a physical control channel may be defined by a set of symbol periods and may extend across the system bandwidth or a subset of the system bandwidth of the carrier. One or more control regions (e.g., CORESETs) may be configured for a set of the UEs 115. For example, one or more of the UEs 115 may monitor or search control regions for control information according to one or more search space sets, and each search space set may include one or multiple control channel candidates in one or more aggregation levels arranged in a cascaded manner. An aggregation level for a control channel candidate may refer to an amount of control channel resources (e.g., control channel elements (CCEs)) associated with encoded information for a control information format having a given payload size. Search space sets may include common search space sets configured for sending control information to multiple UEs 115 and UE-specific search space sets for sending control information to a specific UE 115.

In some examples, a network entity 105 (e.g., a base station 140, an RU 170) may be movable and therefore provide communication coverage for a moving coverage area 110. In some examples, different coverage areas 110 associated with different technologies may overlap, but the different coverage areas 110 may be supported by the same network entity 105. In some other examples, the overlapping coverage areas 110 associated with different technologies may be supported by different network entities 105. The wireless communications system 100 may include, for example, a heterogeneous network in which different types of the network entities 105 provide coverage for various coverage areas 110 using the same or different radio access technologies.

The wireless communications system 100 may be configured to support ultra-reliable communications or low-latency communications, or various combinations thereof. For example, the wireless communications system 100 may be configured to support ultra-reliable low-latency communications (URLLC). The UEs 115 may be designed to support ultra-reliable, low-latency, or critical functions. Ultra-reliable communications may include private communication or group communication and may be supported by one or more services such as push-to-talk, video, or data. Support for ultra-reliable, low-latency functions may include prioritization of services, and such services may be used for public safety or general commercial applications. The terms ultra-reliable, low-latency, and ultra-reliable low-latency may be used interchangeably herein.

In some examples, a UE 115 may be configured to support communicating directly with other UEs 115 via a device-to-device (D2D) communication link 135 (e.g., in accordance with a peer-to-peer (P2P), D2D, or sidelink protocol). In some examples, one or more UEs 115 of a group that are performing D2D communications may be within the coverage area 110 of a network entity 105 (e.g., a base station 140, an RU 170), which may support aspects of such D2D communications being configured by (e.g., scheduled by) the network entity 105. In some examples, one or more UEs 115 of such a group may be outside the coverage area 110 of a network entity 105 or may be otherwise unable to or not configured to receive transmissions from a network entity 105. In some examples, groups of the UEs 115 communicating via D2D communications may support a one-to-many (1:M) system in which each UE 115 transmits to each of the other UEs 115 in the group. In some examples, a network entity 105 may facilitate the scheduling of resources for D2D communications. In some other examples, D2D communications may be carried out between the UEs 115 without an involvement of a network entity 105.

The core network 130 may provide user authentication, access authorization, tracking, Internet Protocol (IP) connectivity, and other access, routing, or mobility functions. The core network 130 may be an evolved packet core (EPC) or 5G core (5GC), which may include at least one control plane entity that manages access and mobility (e.g., a mobility management entity (MME), an access and mobility management function (AMF)) and at least one user plane entity that routes packets or interconnects to external networks (e.g., a serving gateway (S-GW), a Packet Data Network (PDN) gateway (P-GW), or a user plane function (UPF)). The control plane entity may manage non-access stratum (NAS) functions such as mobility, authentication, and bearer management for the UEs 115 served by the network entities 105 (e.g., base stations 140) associated with the core network 130. User IP packets may be transferred through the user plane entity, which may provide IP address allocation as well as other functions. The user plane entity may be connected to IP services 150 for one or more network operators. The IP services 150 may include access to the Internet, Intranet(s), an IP Multimedia Subsystem (IMS), or a Packet-Switched Streaming Service.

The wireless communications system 100 may operate using one or more frequency bands, which may be in the range of 300 megahertz (MHz) to 300 gigahertz (GHz). Generally, the region from 300 MHz to 3 GHz is known as the ultra-high frequency (UHF) region or decimeter band because the wavelengths range from approximately one decimeter to one meter in length. UHF waves may be blocked or redirected by buildings and environmental features, which may be referred to as clusters, but the waves may penetrate structures sufficiently for a macro cell to provide service to the UEs 115 located indoors. Communications using UHF waves may be associated with smaller antennas and shorter ranges (e.g., less than 100 kilometers) compared to communications using the smaller frequencies and longer waves of the high frequency (HF) or very high frequency (VHF) portion of the spectrum below 300 MHz.

The wireless communications system 100 may utilize both licensed and unlicensed RF spectrum bands. For example, the wireless communications system 100 may employ License Assisted Access (LAA), LTE-Unlicensed (LTE-U) radio access technology, or NR technology using an unlicensed band such as the 5 GHz industrial, scientific, and medical (ISM) band. While operating using unlicensed RF spectrum bands, devices such as the network entities 105 and the UEs 115 may employ carrier sensing for collision detection and avoidance. In some examples, operations using unlicensed bands may be based on a carrier aggregation configuration in conjunction with component carriers operating using a licensed band (e.g., LAA). Operations using unlicensed spectrum may include downlink transmissions, uplink transmissions, P2P transmissions, or D2D transmissions, among other examples.

A network entity 105 (e.g., a base station 140, an RU 170) or a UE 115 may be equipped with multiple antennas, which may be used to employ techniques such as transmit diversity, receive diversity, multiple-input multiple-output (MIMO) communications, or beamforming. The antennas of a network entity 105 or a UE 115 may be located within one or more antenna arrays or antenna panels, which may support MIMO operations or transmit or receive beamforming. For example, one or more base station antennas or antenna arrays may be co-located at an antenna assembly, such as an antenna tower. In some examples, antennas or antenna arrays associated with a network entity 105 may be located at diverse geographic locations. A network entity 105 may include an antenna array with a set of rows and columns of antenna ports that the network entity 105 may use to support beamforming of communications with a UE 115. Likewise, a UE 115 may include one or more antenna arrays that may support various MIMO or beamforming operations. Additionally, or alternatively, an antenna panel may support RF beamforming for a signal transmitted via an antenna port.

Beamforming, which may also be referred to as spatial filtering, directional transmission, or directional reception, is a signal processing technique that may be used at a transmitting device or a receiving device (e.g., a network entity 105, a UE 115) to shape or steer an antenna beam (e.g., a transmit beam, a receive beam) along a spatial path between the transmitting device and the receiving device. Beamforming may be achieved by combining the signals communicated via antenna elements of an antenna array such that some signals propagating along particular orientations with respect to an antenna array experience constructive interference while others experience destructive interference. The adjustment of signals communicated via the antenna elements may include a transmitting device or a receiving device applying amplitude offsets, phase offsets, or both to signals carried via the antenna elements associated with the device. The adjustments associated with each of the antenna elements may be defined by a beamforming weight set associated with a particular orientation (e.g., with respect to the antenna array of the transmitting device or receiving device, or with respect to some other orientation).

In some systems, complex data may be encoded using an encoding scheme to represent the complex data in a digital format (e.g., using one or more bits). In some examples, HPCFL encoding may be used to encode complex data in a fixed-point form, which may compress the data to reduce transmission or storage overhead. For example, the fixed point complex data may be encoded in an exponent-mantissa form, where exponent bits indicate a quantity of sign bits that are redundant (e.g., shared) between a real portion and an imaginary portion of the fixed point complex data, and mantissa bits encode bits following the redundant sign bits for each of the real portion and the imaginary portion. For example, the quantity of mantissa bits for each of the real portion and the imaginary portion may be given by the value of M, which may defined by Equation 1 below:

$$M = \frac{(N - E)}{2} \tag{1}$$

where N is the total quantity of bits used by the encoding scheme and E is the quantity of exponent bits.

One example of an HPCFL encoding scheme is 16HPCFL, where 16 bits may be used to encode fixed point complex data. Different values for the exponent bits may encode a different quantity of redundant sign bits, which may be called a shift value. As illustrated in Table 1 below, 16HPCFL may support using two exponent bits (e.g., a value of E=2) or four exponent bits (e.g., a value of E=4).

TABLE 1

| Example 16HPCFL encoding scheme. | | | | | | | | | | |
| --- | --- | --- | --- | --- | --- | --- | --- | --- | --- | --- |
| Redundant Sign Bits | | | | | | | | | | |
| 0 | 1 | 2 | 3 | 4 | 5 | 6 | 7 | 8 | 9 | 10 |

| | 0 | 1 | 2 | 3 | 4 | 5 | 6 | 7 | 8 | 9 | 10 |
| --- | --- | --- | --- | --- | --- | --- | --- | --- | --- | --- | --- |
| Exponent Bits | 4 | 4 | 4 | 4 | 4 | 2 | 2 | 4 | 4 | 4 | 4 |
| Bit 15 | 1 | 1 | 1 | 1 | 1 | 0 | 0 | 1 | 1 | 1 | 1 |
| Bit 14 | 0 | 0 | 0 | 0 | 1 | 0 | 1 | 1 | 1 | 1 | 1 |
| Bit 13 | 0 | 0 | 1 | 1 | 0 | M | M | 0 | 1 | 1 | 1 |
| Bit 12 | 0 | 1 | 0 | 1 | 0 | M | M | 1 | 0 | 1 | 1 |

As shown in Table 1, the example 16HPCFL encoding scheme may support 10 different shift values (e.g., a quantity of redundant sign bits between zero and nine). For example, as exemplified in Table 1, there may not be any remaining values for the exponent bits to encode a quantity of 10 redundant sign bits. The bits labeled M correspond to mantissa bits used to encode the real portion or the imaginary portion of the complex data. In some examples, the first exponent bit (e.g., Bit 15) may have a value of zero to indicate that the total quantity of exponent bits is two, and the first exponent bit may have a value of one to indicate that the total quantity of exponent bits is four. In different variations of this encoding scheme, however, this may be different, as may the values for the exponent bits that correspond to each shift value. For example, Table 2 below illustrates how the 16HPCFL encoding scheme may be modified such that different shift values are encoded using two exponent bits, which may be selected based on a value of the parameter S.

TABLE 2

| Quantity of exponent bits for different values of S parameter and shift. | | | | | | | | |
| --- | --- | --- | --- | --- | --- | --- | --- | --- |
| Shift | S = 0 | S = 1 | S = 2 | S = 3 | S = 4 | S = 5 | S = 6 | S = 7 |
| 0 | 2 | 4 | 4 | 4 | 4 | 4 | 4 | 4 |
| 1 | 2 | 2 | 4 | 4 | 4 | 4 | 4 | 4 |
| 2 | 4 | 2 | 2 | 4 | 4 | 4 | 4 | 4 |
| 3 | 4 | 4 | 2 | 2 | 4 | 4 | 4 | 4 |

TABLE 2-continued

Quantity of exponent bits for different
values of S parameter and shift.

| Shift | S = 0 | S = 1 | S = 2 | S = 3 | S = 4 | S = 5 | S = 6 | S = 7 |
|---|---|---|---|---|---|---|---|---|
| 4 | 4 | 4 | 4 | 2 | 2 | 4 | 4 | 4 |
| 5 | 4 | 4 | 4 | 4 | 2 | 2 | 4 | 4 |
| 6 | 4 | 4 | 4 | 4 | 4 | 2 | 2 | 4 |
| 7 | 4 | 4 | 4 | 4 | 4 | 4 | 2 | 2 |
| 8 | 4 | 4 | 4 | 4 | 4 | 4 | 4 | 2 |
| 9 | 4 | 4 | 4 | 4 | 4 | 4 | 4 | 4 |
| 10 | 4 | 4 | 4 | 4 | 4 | 4 | 4 | 4 |

Encoding complex data using a lower quantity of exponent bits may increase the precision of the encoded complex data. For example, as shown in Table 1, encoding complex data using two exponent bits may result in two additional bits for encoding the mantissa portion (e.g., M=7, resulting in one additional bit for each of the real portion and the imaginary portion). As such, it may be beneficial to select a value for S such that most commonly used shift values are encoded using the lower quantity of exponent bits. In some examples, the parameter S may be selected based on a location of a peak SQNR. In some cases, the most commonly used shift values may vary by application or by the complex data set being encoded. For example, the value of the parameter S may be adjusted (e.g., optimized) based on a power level associated with an input signal. In this example, a shift value of 10 may not be achieved as the quantity of possible shift values may be limited by using a first bit to identify between a two bit exponent value or a four bit exponent value.

As HPCFL is a fixed length encoding scheme, a portion of a fixed bit length may be used for the exponent bits, and the remaining bits may be divided between the real portion and the imaginary portion of the complex data. In the 16HPCFL example illustrated with respect to Tables 1 and 2, the exponent bits may use a quantity of four bits or two bits, and the remaining bits (e.g., 12 or 14 bits) may be used to encode the real and imaginary portions (e.g., using six bits each for four exponent bits, or seven bits each for two exponent bits). In some examples, the quantity of exponent bits may be an even integer value such that the real portion and the imaginary portions are encoded with a same quantity of bits. However, this may limit the possible shift values (e.g., the possible quantity of redundant sign bits) that may be encoded. For example, in 16HPCFL as described with reference to Tables 1 and 2, the exponent bits may encode a shift value between zero and nine. For a device to encode a larger shift value, the device may use an encoding scheme with a larger quantity of bits (e.g., 20HPCFL), but this may increase power consumption and overhead for transmissions due to the larger quantity of bits. As such, techniques for supporting a larger quantity of shift values without increasing the total quantity of bits may be desired.

In accordance with techniques as described herein, a transmitting device may use an asymmetric encoding scheme to encode fixed point complex data. For example, an odd integer quantity of exponent bits may be used to encode a shift value of the fixed point complex data. As such, an odd quantity of bits may remain to encoding of a real portion and an imaginary portion of the fixed point complex data, resulting in asymmetric encoding. For example, in 16HPCFL, three bits may be used for the exponent bits, leaving 13 bits for the real portion and the imaginary portion. As such, one of the real portion or the imaginary portion may be encoded using 6 bits, and the other may be encoded using 7 bits. In some examples, the transmitting device may be configured with a rule or formula for determining which portion to encode with a larger quantity of bits. In some cases, one of the real portion or the imaginary portion may always be encoded with the larger quantity of bits. In some other examples, the transmitting device may determine whether the real portion or the imaginary portion contains a largest quantity of redundant (e.g., repeated) sign bits, and the transmitting device may encode the portion with the largest quantity of redundant sign bits using the larger quantity of bits. A receiving device may also be configured to determine which portion (e.g., the real portion or the imaginary portion) is encoded with the larger quantity of bits, allowing the receiving device to decode the complex data. Accordingly, by encoding the fixed point complex data using an asymmetric encoding scheme, a larger quantity of shift values may be supported without increasing the total quantity of bits of the encoding scheme.

Figure 2:
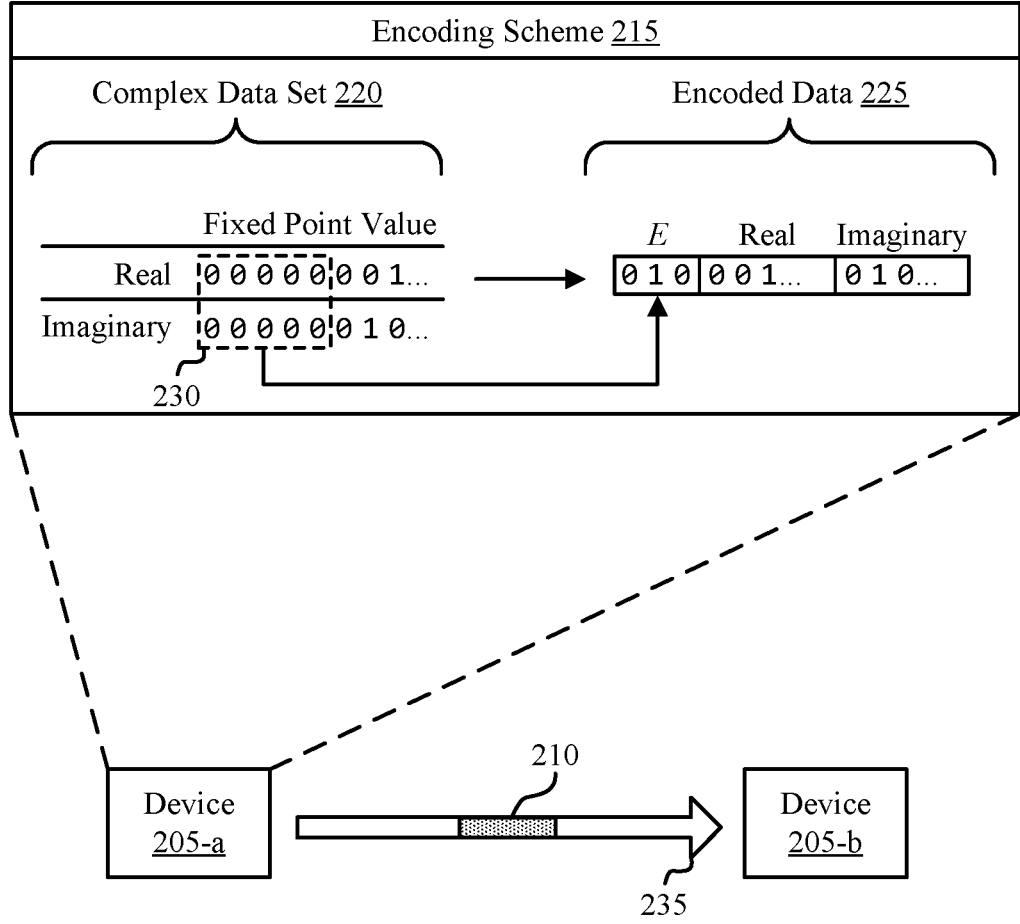
FIG. 2 shows an example of a wireless communications system that supports asymmetric encoding schemes in accordance with one or more aspects of the present disclosure.

FIG. 2 shows an example of a wireless communications system 200 that supports asymmetric encoding schemes in accordance with one or more aspects of the present disclosure. The wireless communications system 200 includes a device 205-a and a device 205-b, which may be examples of a UE 115 or a network entity 105, as described herein. In some examples, the device 205-a and the device 205-b may communicate via a communication link 235, which may be an example of a communication link as described with reference to FIG. 1 (e.g., a communication link 125, a communication link 155, a backhaul communication link 120, a midhaul communication link 162, a fronthaul communication link 168).

In some examples, the device 205-a may encode a complex data set 220 for transmission to the device 205-b using an encoding scheme 215 (e.g., an asymmetric encoding scheme, an asymmetric HPFCL encoding scheme). In some examples, the complex data set 220 may include a real portion and an imaginary portion that may share a quantity of redundant sign bits 230 (e.g., a quantity of sign bits for the real portion and the imaginary portion that are the same). The encoding scheme 215 may remove the redundant sign bits 230 and encode the redundant sign bits 230 using exponent bits in the encoded data 225. In some examples, the real portion or the imaginary portion may have a larger quantity of redundant sign bits. As such, the encoding scheme 215 may remove the smallest (e.g., the minimum) quantity of redundant sign bits of the real portion and the imaginary portion.

In accordance with examples as described herein, the encoding scheme 215 may support asymmetric encoding of the complex data set 220. For example, the device 205-a may encode the redundant sign bits 230 using an odd integer quantity of exponent bits in accordance with the encoding scheme 215. This may result in an odd integer quantity of remaining bits for encoding the real portion and the imaginary portion of the complex data set 220. As such, the quantity of bits (e.g., mantissa bits) for encoding the real portion may be different than the quantity of bits (e.g., mantissa bits) for encoding the imaginary portion.

The device 205-a may determine whether the real portion or the imaginary portion will be encoded using a larger quantity of bits. In some examples, the device 205-a may perform static encoding, in which the device 205-a may always encode one of the real portion and the imaginary portion with a larger quantity of bits (e.g., seven bits for 16HPCFL encoding using three exponent bits). In these examples, the device 205-b may be configured to decode the one of the real portion and the imaginary portion based on having the larger quantity of bits, such that the device 205-*b* may successfully decode a message 210 including the encoded data 225 from the device 205-*a*.

In some other examples, the device 205-*a* may perform dynamic encoding, in which the portion encoded with the larger quantity of bits depends on a rule, formula, or condition associated with the complex data set 220. For example, the device 205-*a* may determine which portion (e.g., the real portion or the imaginary portion) of the complex data set 220 contains a larger quantity of redundant sign bits. The device 205-*a* may encode the portion with the larger quantity of redundant sign bits with the larger quantity of bits.

In some cases, the device 205-*b* may be unaware of which portion contains the larger quantity of redundant sign bits. As such, to determine which portion is encoded with the larger quantity of bits, the device 205-*b* may count the quantity of redundant sign bits for the real portion and for the imaginary portion. However, as the real portion and the imaginary portion may be encoded with a different quantity of bits (e.g., mantissa bits), the device 205-*b* may not be able to determine with which bit to start counting for one of the portions.

Accordingly, to assist the device 205-*b* in counting the quantity of redundant sign bits, the encoded data 225 may take the form [E $M_{real}$ flpr($M_{imag}$)], where E corresponds to the exponent bits, $M_{real}$ corresponds to the mantissa bits for the real portion, $M_{imag}$ corresponds to the mantissa bits for the imaginary portion, and flpr( ) refers to a flip-left-to-right operation. For example, to encode the imaginary portion, the device 205-*a* may perform the flip-left-to-right operation. By flipping the mantissa bits for the imaginary portion, the device 205-*b* may count redundant bits for the real portion starting from the most significant bit (e.g., from the left) following the exponent bits, and the device 205-*b* may count redundant bits for the imaginary portion starting from the least significant bit (e.g., from the right). In some other examples, however, the imaginary portion may be included first (e.g., in most significant bits), and the flip-left-to-right operation may be performed on the real portion. As such, the device 205-*b* may successfully determine which portion contains the larger quantity of redundant bits, and thereby determine which portion is encoded with a larger quantity of bits (e.g., whether the middle bit excluding the exponent bits belongs to the real portion or the imaginary portion).

In some examples, the device 205-*a* may use a generalized formula to determine which portion is encoded with the larger quantity of bits. For example, the device 205-*a* may first count the quantity of redundant sign bits for the real portion, denoted as $R_r$, and the quantity of redundant sign bits for the imaginary portion, denoted as $R_i$. The device 205-*a* may determine the exponent bits (e.g., a quantity of exponent bits and a value for the exponent bits) based on a smallest of $R_r$ and $R_i$, denoted as R (e.g., R=min ($R_r$, $R_i$)). If the quantity of redundant sign bits for the real portion is larger than the quantity of redundant sign bits for the imaginary portion (e.g., $R_r$>$R_i$), the device 205-*a* may determine the quantity of bits for the real portion, denoted as $N_{real}$, using Equation 2 below, and the quantity of bits for the imaginary portion, denoted as $N_{imag}$, using Equation 3 below.

$$N_{real} = \text{floor}\left(\frac{N - E - R + R_r}{2}\right) \quad (2)$$

-continued
$$N_{imag} = \text{ceil}\left(\frac{N - E - R_r + R}{2}\right) \quad (3)$$

where N is the total quantity of bits associated with the encoding scheme 215 and E is the quantity of exponent bits, floor( ) denotes a floor function, ceil( ) denotes a ceiling function, and R=min ($R_r$, $R_i$) which is equal to $R_i$ in this case.

Alternatively, if the quantity of redundant sign bits for the imaginary portion is larger than the quantity of redundant sign bits for the real portion (e.g., $R_i$>$R_r$), the device 205-*a* may determine the quantity of bits for the real portion and the quantity of bits for the imaginary portion using Equations 4 and 5 below.

$$N_{real} = \text{ceil}\left(\frac{N - E - R_i + R}{2}\right) \quad (4)$$

$$N_{imag} = \text{floor}\left(\frac{N - E - R + R_i}{2}\right) \quad (5)$$

Accordingly, by supporting asymmetric encoding of the complex data set 220, the encoding scheme 215 may support encoding a larger quantity of shift values. For example, for 16HPCFL, the encoding scheme 215 may support encoding a shift value between 0 and 10, as illustrated in more detail with respect to FIGS. 3A and 3B. By supporting asymmetric encoding schemes, the device 205-*a* and the device 205-*b* may experience a SQNR for a larger range of input signal power values relative to non-asymmetric encoding techniques. Accordingly, these techniques may achieve a more robust throughput performance when there is a relatively high variance in the input signal power. As such, communication performance between the device 205-*a* and the device 205-*b* may be improved without increasing the total quantity of bits used for encoding of a signal.

FIG. 3A shows an example of an encoding scheme 300-*a* that supports asymmetric encoding 320 in accordance with one or more aspects of the present disclosure. The encoding scheme 300-*a* may be used by a device to encode a complex data set, as described herein with respect to FIGS. 1 and 2.

As illustrated in FIG. 3A, the encoding scheme 300-*a* may support using an odd integer quantity of exponent bits 310 to encode redundant sign bits 305 (e.g., a shift value) of a complex data set. For example, the encoding scheme 300-*a* may use three exponent bits 310 to encode two possible quantities of redundant sign bits 305. As depicted, the encoding scheme 300-*a* may correspond to an encoding scheme for a parameter S with a value of four, as described herein. For example, a quantity of four redundant sign bits 305 may be encoded using a quantity of two exponent bits 310, a quantity of five or six redundant sign bits 305 may be encoded using a quantity of three exponent bits 310, and other quantities of redundant sign bits 305 (e.g., quantities between zero and three or seven and 10) may be encoded using a quantity of four exponent bits 310. However, these values are exemplary and may vary depending on the value of the parameter S, as illustrated in more detail with reference to FIG. 3B.

In some examples, a value of a bit 315-*a* of the encoded data (e.g., a first exponent bit, a most significant bit) may indicate the quantity of exponent bits 310 used to encode the redundant sign bits 305. For example, a value of one for the bit 315-*a* may indicate that four exponent bits 310 (e.g., the bit 315-*a*, a bit 315-*b*, a bit 315-*c*, and a bit 315-*d*) are used to encode the redundant sign bits 305. A value of zero for the bit 315-a may indicate that two or three exponent bits 310 are used to encode the redundant sign bits 305. In some example, a value of the bit 315-b may further be used to identify the quantity of exponent bits 310 used to encode the redundant sign bits 305. For example, a value of 0 for the bit 315-b may indicate that two exponent bits 310 are used (e.g., the bit 315-a and the bit 315-b), and that the bit 315-c and the bit 315-d are part of the mantissa bits, denoted by M, for the real portion or the imaginary portion. Similarly, a value of 1 for the bit 315-b may indicate that three exponent bits 310 (e.g., the bit 315-a, the bit 315-b, and the bit 315-c) are used to encode the redundant sign bits 305, and the bit 315-d is part of the mantissa bits, denoted by M, for the real portion or the imaginary portion of the complex data set.

Accordingly, by supporting asymmetric encoding 320 of complex data sets 220, the encoding scheme 300-a may support encoding a larger quantity of redundant sign bits (e.g., a quantity between zero and 10) using the same quantity of total bits as non-asymmetric encoding schemes.

FIG. 3B shows an example of a shift diagram 300-b that supports asymmetric encoding schemes in accordance with one or more aspects of the present disclosure. The shift diagram 300-b illustrates how the encoding scheme 300-a may be modified according to a parameter S, such that values for the exponent bits that correspond to each shift value 325 (e.g., the quantity of redundant sign bits 305) are different.

As illustrated in FIG. 3B, the value of the S parameter may correspond to the shift value that is encoded using a quantity of two exponent bits. In some examples, shift values equal to S+1 or S+2 may be encoded using a quantity of three exponent bits, which may correspond to asymmetric encoding 320 as described herein. The values depicted in the shift diagram 300-b are non-limiting, and other values may be used in different implementations.

In some examples, the value of the parameter S may be selected based on a location of a peak signal-to-quantization-noise ratio (SQNR). Additionally, or alternatively, value of the parameter S may be selected based on most commonly used shift values, which may vary by application or by the complex data set being encoded. For example, the value of the parameter S may be adjusted (e.g., optimized) based on a power level associated with an input signal associated with the complex data. In some cases, a transmitting device and a receiving device may each be configured with the value of the S parameter. Additionally, or alternatively, the transmitting device may indicate the value of the S parameter to the receiving device (e.g., prior to a transmission).

Figure 4:
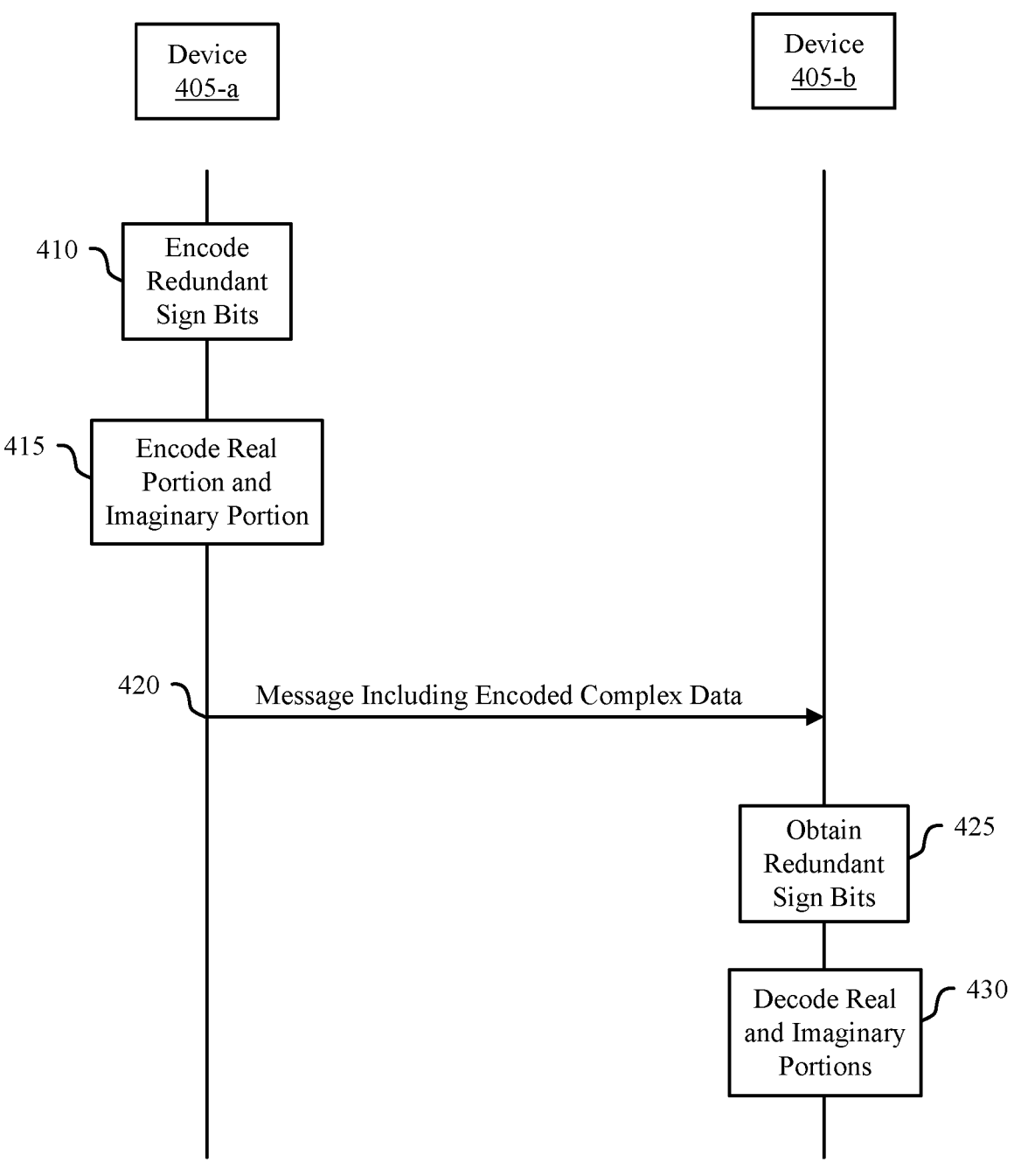
FIG. 4 shows an example of a process flow that supports asymmetric encoding schemes in accordance with one or more aspects of the present disclosure.

FIG. 4 shows an example of a process flow 400 that supports asymmetric encoding schemes in accordance with one or more aspects of the present disclosure. The process flow 400 illustrates communications between a device 405-a and a device 405-b, which may be examples of a device 205 (e.g., such as a UE 115 or a network entity 105), as described herein. In some examples, operations shown in the process flow 400 may be performed in different orders than shown or not performed at all. In some cases, additional operations may be included in the process flow 400.

At 410, the device 405-a may encode redundant sign bits of a fixed point complex data set that includes a real portion and an imaginary portion. The redundant sign bits may be encoded as a first subset of bits (e.g., exponent bits) of a total set of bits for encoding the fixed point complex data set. In some examples, the quantity of the first subset of bits may be based on a compression encoding scheme (e.g., an asymmetric encoding scheme), as described herein. For example, the quantity of the first subset of bits may be an odd integer value.

At 415, the device 405-a may encode the real portion and the imaginary portion of the fixed point complex data set in accordance with the compression encoding scheme. The real portion and the imaginary portion may be encoded as a second subset of bits (e.g., mantissa bits) of the total set of bits. For example, a first portion of the second subset of bits may indicate the real portion (e.g., up to some level of precision), and a second portion of the second subset of bits may indicate the imaginary portion (e.g., up to some level of precision). In some examples, a quantity of bits of the first portion may be different form a quantity of bits of the second portion based on the quantity of the first subset of bits being an odd integer value in accordance with the compression encoding scheme, as described herein.

At 420, the device 405-a may transmit a message including the total set of bits, which may indicate the fixed point complex data set, to the device 405-a.

At 425, the device 405-b may obtain the first subset of bits of the total set of bits based on receiving the message from the device 405-a. The first subset of bits may indicate the quantity of redundant sign bits that are redundant for the real portion and the imaginary portion, and the quantity of the first subset of bits may be based on the compression encoding scheme.

At 430, the device 405-b may decode the second subset of bits of the total set of bits. The first portion of the second subset of bits may indicate the real portion of the fixed point complex data set and the second portion of the second subset of bits may indicate the imaginary portion of the fixed point complex data set. As described herein, the quantity of bits of the first portion may be different from the quantity of bits of the second portion based on the quantity of the first subset of bits being an odd integer value.

In some examples, to decode the second subset of bits, the device 405-b may count a first quantity of redundant sign bits of the first portion of the second subset of bits and a second quantity of redundant sign bits of the second portion of the second subset of bits. In some cases, the first quantity of redundant sign bits may be counted sequentially beginning from a starting bit (e.g., a most significant bit) of the second subset of bits, and the second quantity of redundant sign bits may be counted sequentially beginning from a last bit (e.g., a least significant bit) of the second subset of bits based at least in part on a flip-left-to-right operation performed on the second portion of the second subset of bits including the second quantity of redundant sign bits (e.g., by the device 405-a prior to transmission). Accordingly, the device 405-b may successfully decode the fixed point complex data set in accordance with the compression encoding scheme.

Figure 5:
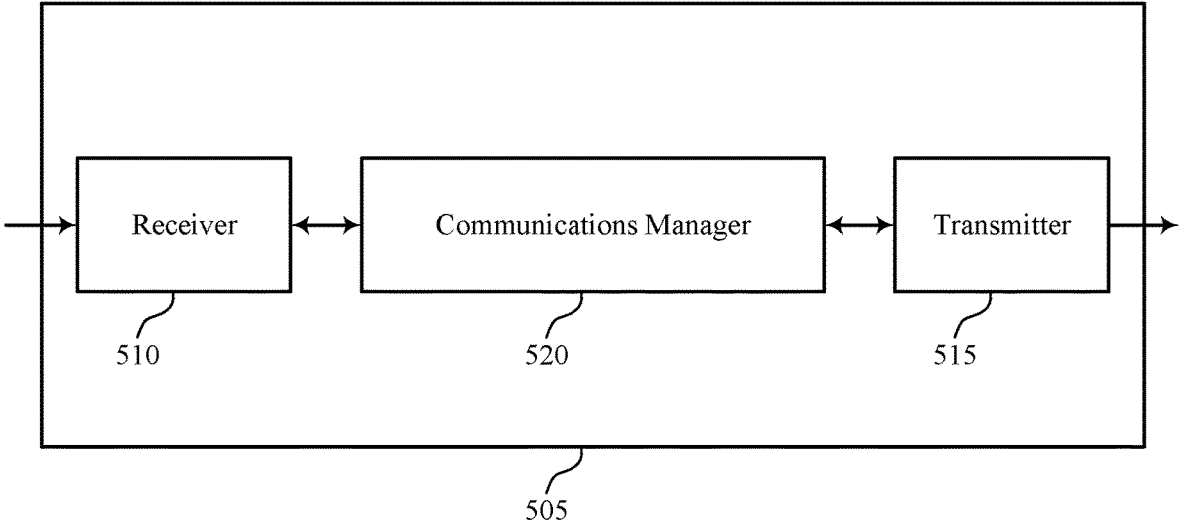
FIGS. 5 and 6 show block diagrams of devices that support asymmetric encoding schemes in accordance with one or more aspects of the present disclosure.

FIG. 5 shows a block diagram 500 of a device 505 that supports asymmetric encoding schemes in accordance with one or more aspects of the present disclosure. The device 505 may be an example of aspects of a UE 115 or a network entity 105 as described herein. The device 505 may include a receiver 510, a transmitter 515, and a communications manager 520. The device 505, or one or more components of the device 505 (e.g., the receiver 510, the transmitter 515, and the communications manager 520), may include at least one processor, which may be coupled with at least one memory, to, individually or collectively, support or enable the described techniques. Each of these components may be in communication with one another (e.g., via one or more buses).

The receiver 510 may provide a means for receiving information such as packets, user data, control information, or any combination thereof associated with various information channels (e.g., control channels, data channels, information channels related to asymmetric encoding schemes). Information may be passed on to other components of the device 505. The receiver 510 may utilize a single antenna or a set of multiple antennas.

The transmitter 515 may provide a means for transmitting signals generated by other components of the device 505. For example, the transmitter 515 may transmit information such as packets, user data, control information, or any combination thereof associated with various information channels (e.g., control channels, data channels, information channels related to asymmetric encoding schemes). In some examples, the transmitter 515 may be co-located with a receiver 510 in a transceiver module. The transmitter 515 may utilize a single antenna or a set of multiple antennas.

The communications manager 520, the receiver 510, the transmitter 515, or various combinations thereof or various components thereof may be examples of means for performing various aspects of asymmetric encoding schemes as described herein. For example, the communications manager 520, the receiver 510, the transmitter 515, or various combinations or components thereof may be capable of performing one or more of the functions described herein.

In some examples, the communications manager 520, the receiver 510, the transmitter 515, or various combinations or components thereof may be implemented in hardware (e.g., in communications management circuitry). The hardware may include at least one of a processor, a digital signal processor (DSP), a central processing unit (CPU), a graphics processing unit (GPU), a neural processing unit (NPU), an application-specific integrated circuit (ASIC), a field-programmable gate array (FPGA) or other programmable logic device, a microcontroller, discrete gate or transistor logic, discrete hardware components, or any combination thereof configured as or otherwise supporting, individually or collectively, a means for performing the functions described in the present disclosure. In some examples, at least one processor and at least one memory coupled with the at least one processor may be configured to perform one or more of the functions described herein (e.g., by one or more processors, individually or collectively, executing instructions stored in the at least one memory).

Additionally, or alternatively, the communications manager 520, the receiver 510, the transmitter 515, or various combinations or components thereof may be implemented in code (e.g., as communications management software) executed by at least one processor (e.g., directly, indirectly, after pre-processing, without pre-processing). If implemented in code executed by at least one processor, the functions of the communications manager 520, the receiver 510, the transmitter 515, or various combinations or components thereof may be performed by a general-purpose processor, a DSP, a CPU, a GPU, an NPU, an ASIC, an FPGA, a microcontroller, or any combination of these or other programmable logic devices (e.g., configured as or otherwise supporting, individually or collectively, a means for performing the functions described in the present disclosure).

In some examples, the communications manager 520 may be configured to perform various operations (e.g., receiving, obtaining, monitoring, outputting, transmitting) using or otherwise in cooperation with the receiver 510, the transmitter 515, or both. For example, the communications manager 520 may receive information from the receiver 510, send information to the transmitter 515, or be integrated in combination with the receiver 510, the transmitter 515, or both to obtain information, output information, or perform various other operations as described herein.

The communications manager 520 may support wireless communications in accordance with examples as disclosed herein. For example, the communications manager 520 is capable of, configured to, or operable to support a means for encoding a first subset of bits of a total set of bits that are configured for encoding a fixed point complex data set that includes a real portion and an imaginary portion, where the first subset of bits indicates a quantity of redundant sign bits that are redundant for the real portion and the imaginary portion, and where a quantity of the first subset of bits is based on a compression encoding scheme. The communications manager 520 is capable of, configured to, or operable to support a means for encoding a second subset of bits of the total set of bits, where a first portion of the second subset of bits indicates the real portion of the fixed point complex data set and a second portion of the second subset of bits indicates the imaginary portion of the fixed point complex data set, and where a first quantity of bits of the first portion is different from a second quantity of bits of the second portion based on the quantity of the first subset of bits being an odd integer value in accordance with the compression encoding scheme. The communications manager 520 is capable of, configured to, or operable to support a means for transmitting a message including the total set of bits.

Additionally, or alternatively, the communications manager 520 may support wireless communications in accordance with examples as disclosed herein. For example, the communications manager 520 is capable of, configured to, or operable to support a means for receiving a message including a total set of bits associated with encoding a fixed point complex data set that includes a real portion and an imaginary portion. The communications manager 520 is capable of, configured to, or operable to support a means for obtaining, basing at least in part on receiving the message, a first subset of bits of the total set of bits, the first subset of bits indicating a quantity of redundant sign bits that are redundant for the real portion and the imaginary portion, where a quantity of the first subset of bits is based on a compression encoding scheme. The communications manager 520 is capable of, configured to, or operable to support a means for decoding a second subset of bits of the total set of bits, where a first portion of the second subset of bits indicates the real portion of the fixed point complex data set and a second portion of the second subset of bits indicates the imaginary portion of the fixed point complex data set, and where a first quantity of bits of the first portion is different from a second quantity of bits of the second portion based on the quantity of the first subset of bits being an odd integer value in accordance with the compression encoding scheme.

By including or configuring the communications manager 520 in accordance with examples as described herein, the device 505 (e.g., at least one processor controlling or otherwise coupled with the receiver 510, the transmitter 515, the communications manager 520, or a combination thereof) may support techniques for an asymmetric encoding scheme that supports more efficient communications (e.g., wired or wireless communications) between the device 505 and other devices.

Figure 6:
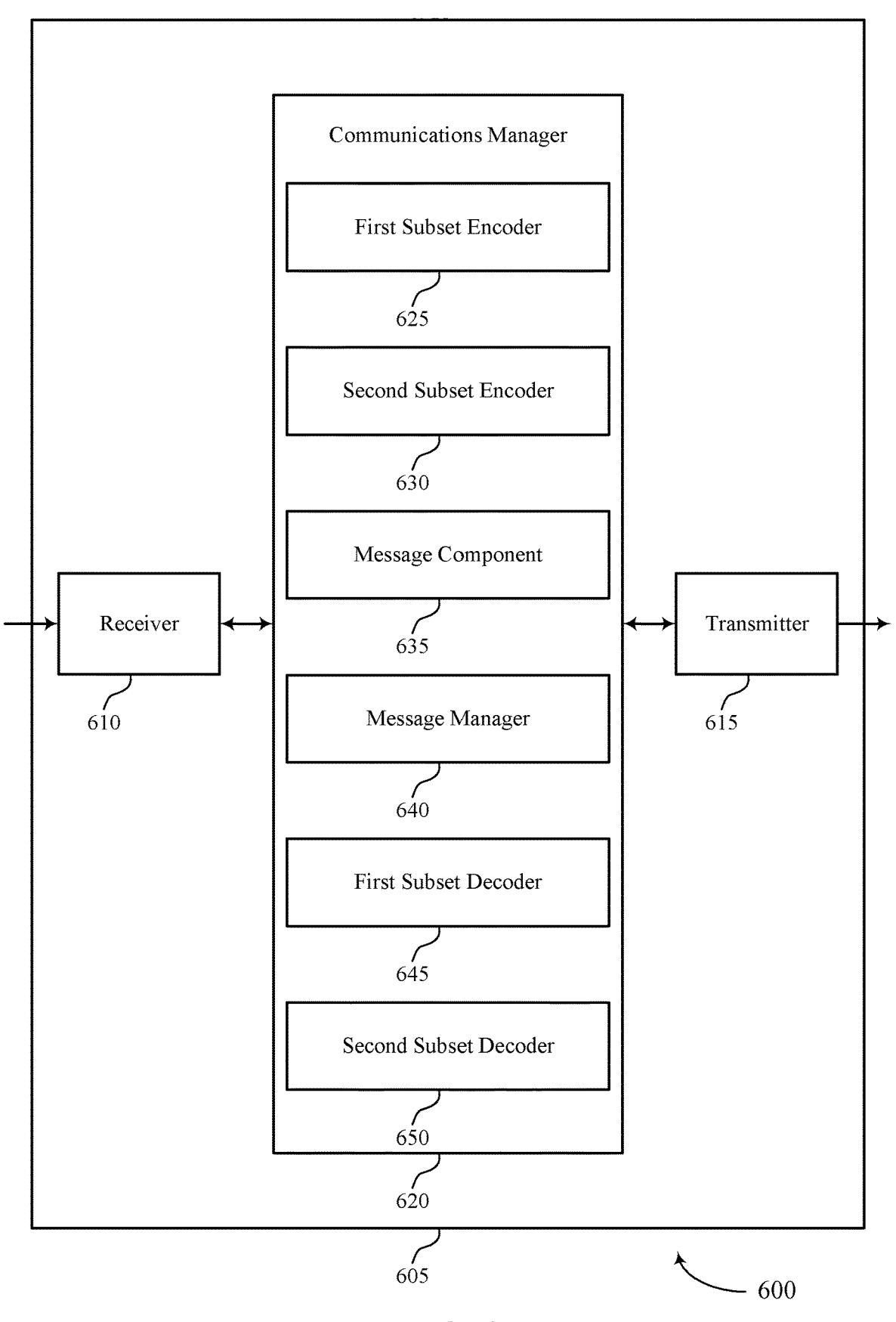

FIG. 6 shows a block diagram 600 of a device 605 that supports asymmetric encoding schemes in accordance with one or more aspects of the present disclosure. The device 605 may be an example of aspects of a device 505, a UE 115, or a network entity 105 as described herein. The device 605 may include a receiver 610, a transmitter 615, and a communications manager 620. The device 605, or one of more components of the device 605 (e.g., the receiver 610, the transmitter 615, and the communications manager 620), may include at least one processor, which may be coupled with at least one memory, to support the described techniques. Each of these components may be in communication with one another (e.g., via one or more buses).

The receiver 610 may provide a means for receiving information such as packets, user data, control information, or any combination thereof associated with various information channels (e.g., control channels, data channels, information channels related to asymmetric encoding schemes). Information may be passed on to other components of the device 605. The receiver 610 may utilize a single antenna or a set of multiple antennas.

The transmitter 615 may provide a means for transmitting signals generated by other components of the device 605. For example, the transmitter 615 may transmit information such as packets, user data, control information, or any combination thereof associated with various information channels (e.g., control channels, data channels, information channels related to asymmetric encoding schemes). In some examples, the transmitter 615 may be co-located with a receiver 610 in a transceiver module. The transmitter 615 may utilize a single antenna or a set of multiple antennas.

The device 605, or various components thereof, may be an example of means for performing various aspects of asymmetric encoding schemes as described herein. For example, the communications manager 620 may include a first subset encoder 625, a second subset encoder 630, a message component 635, a message manager 640, a first subset decoder 645, a second subset decoder 650, or any combination thereof. The communications manager 620 may be an example of aspects of a communications manager 520 as described herein. In some examples, the communications manager 620, or various components thereof, may be configured to perform various operations (e.g., receiving, obtaining, monitoring, outputting, transmitting) using or otherwise in cooperation with the receiver 610, the transmitter 615, or both. For example, the communications manager 620 may receive information from the receiver 610, send information to the transmitter 615, or be integrated in combination with the receiver 610, the transmitter 615, or both to obtain information, output information, or perform various other operations as described herein.

The communications manager 620 may support wireless communications in accordance with examples as disclosed herein. The first subset encoder 625 is capable of, configured to, or operable to support a means for encoding a first subset of bits of a total set of bits that are configured for encoding a fixed point complex data set that includes a real portion and an imaginary portion, where the first subset of bits indicates a quantity of redundant sign bits that are redundant for the real portion and the imaginary portion, and where a quantity of the first subset of bits is based on a compression encoding scheme. The second subset encoder 630 is capable of, configured to, or operable to support a means for encoding a second subset of bits of the total set of bits, where a first portion of the second subset of bits indicates the real portion of the fixed point complex data set and a second portion of the second subset of bits indicates the imaginary portion of the fixed point complex data set, and where a first quantity of bits of the first portion is different from a second quantity of bits of the second portion based on the quantity of the first subset of bits being an odd integer value in accordance with the compression encoding scheme.

In some examples, the second subset encoder 630 is capable of, configured to, or operable to support a means for performing a flip-left-to-right operation on the second portion of the second subset of bits, wherein encoding the second subset of bits is based at least in part on performing the flip-left-to-right operation. The message component 635 is capable of, configured to, or operable to support a means for transmitting a message including the total set of bits.

Additionally, or alternatively, the communications manager 620 may support wireless communications in accordance with examples as disclosed herein. The message manager 640 is capable of, configured to, or operable to support a means for receiving a message including a total set of bits associated with encoding a fixed point complex data set that includes a real portion and an imaginary portion. The first subset decoder 645 is capable of, configured to, or operable to support a means for obtaining, based on receiving the message, a first subset of bits of the total set of bits, the first subset of bits indicating a quantity of redundant sign bits that are redundant for the real portion and the imaginary portion, where a quantity of the first subset of bits is based on a compression encoding scheme. The second subset decoder 650 is capable of, configured to, or operable to support a means for decoding a second subset of bits of the total set of bits, where a first portion of the second subset of bits indicates the real portion of the fixed point complex data set and a second portion of the second subset of bits indicates the imaginary portion of the fixed point complex data set, and where a first quantity of bits of the first portion is different from a second quantity of bits of the second portion based on the quantity of the first subset of bits being an odd integer value in accordance with the compression encoding scheme.

Figure 7:
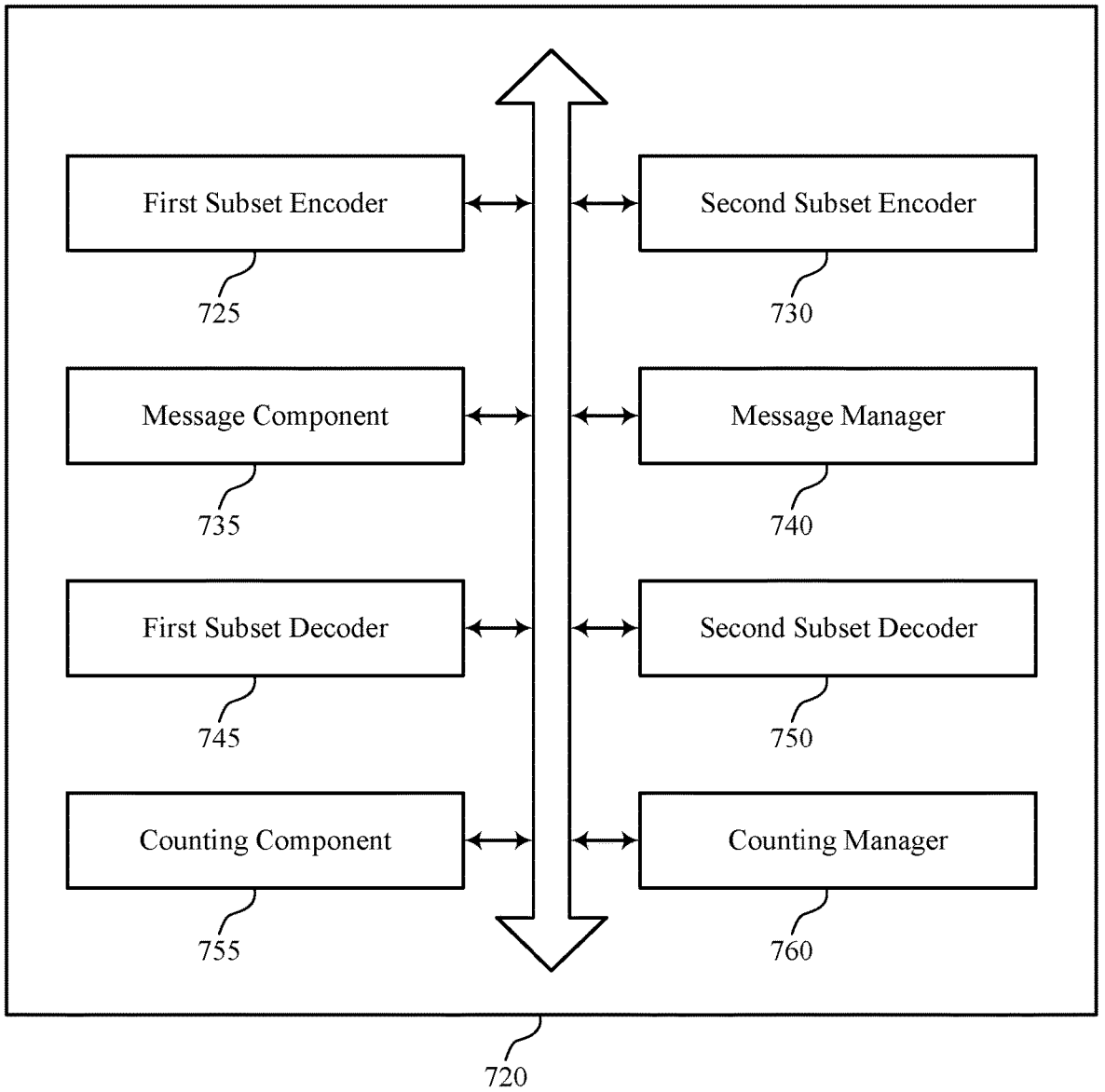
FIG. 7 shows a block diagram of a communications manager that supports asymmetric encoding schemes in accordance with one or more aspects of the present disclosure.

FIG. 7 shows a block diagram 700 of a communications manager 720 that supports asymmetric encoding schemes in accordance with one or more aspects of the present disclosure. The communications manager 720 may be an example of aspects of a communications manager 520, a communications manager 620, or both, as described herein. The communications manager 720, or various components thereof, may be an example of means for performing various aspects of asymmetric encoding schemes as described herein. For example, the communications manager 720 may include a first subset encoder 725, a second subset encoder 730, a message component 735, a message manager 740, a first subset decoder 745, a second subset decoder 750, a counting component 755, a counting manager 760, or any combination thereof. Each of these components, or components or subcomponents thereof (e.g., one or more processors, one or more memories), may communicate, directly or indirectly, with one another (e.g., via one or more buses) which may include communications within a protocol layer of a protocol stack, communications associated with a logical channel of a protocol stack (e.g., between protocol layers of a protocol stack, within a device, component, or virtualized component associated with a network entity 105, between devices, components, or virtualized components associated with a network entity 105), or any combination thereof.

The communications manager 720 may support wireless communications in accordance with examples as disclosed herein. The first subset encoder 725 is capable of, configured to, or operable to support a means for encoding a first subset of bits of a total set of bits that are configured for encoding a fixed point complex data set that includes a real portion and an imaginary portion, where the first subset of bits indicates a quantity of redundant sign bits that are redundant for the real portion and the imaginary portion, and where a quantity of the first subset of bits is based on a compression encoding scheme. The second subset encoder 730 is capable of, configured to, or operable to support a means for encoding a second subset of bits of the total set of bits, where a first portion of the second subset of bits indicates the real portion of the fixed point complex data set and a second portion of the second subset of bits indicates the imaginary portion of the fixed point complex data set, and where a first quantity of bits of the first portion is different from a second quantity of bits of the second portion based on the quantity of the first subset of bits being an odd integer value in accordance with the compression encoding scheme. The message component 735 is capable of, configured to, or operable to support a means for transmitting a message including the total set of bits.

In some examples, the quantity of the first portion of the second subset of bits associated with the real portion is larger than the quantity of the second portion of the second subset of bits associated with the imaginary portion. In some examples, the quantity of the first portion of the second subset of bits associated with the imaginary portion is larger than the quantity of the second portion of the second subset of bits associated with the real portion.

In some examples, the counting component 755 is capable of, configured to, or operable to support a means for counting a quantity of redundant sign bits for the real portion and a quantity of redundant sign bits for the imaginary portion, where encoding the second subset of bits is based on the counting.

In some examples, the second subset encoder 730 is capable of, configured to, or operable to support a means for encoding the first portion of the second subset of bits having the first quantity of bits, where the first quantity of bits of the first portion is larger than the second quantity of bits of the second portion based on the quantity of redundant sign bits for the real portion being larger than the quantity of redundant sign bits for the imaginary portion. In some examples, the total set of bits includes 16 bits, the quantity of the first subset of bits includes three bits, the first quantity of bits includes seven bits, and the second quantity of bits includes six bits.

In some examples, the second subset encoder 730 is capable of, configured to, or operable to support a means for encoding the second portion of the second subset of bits having the second quantity of bits, where the second quantity of bits of the second portion is larger than the first quantity of bits of the first portion based on the quantity of redundant sign bits for the imaginary portion being larger than the quantity of redundant sign bits for the real portion. In some examples, the total set of bits includes 16 bits, the quantity of the first subset of bits includes three bits, the first quantity of bits includes six bits, and the second quantity of bits includes seven bits.

In some examples, the second subset encoder 730 is capable of, configured to, or operable to support a means for performing a flip-left-to-right operation on the second portion of the second subset of bits, wherein encoding the second subset of bits is based at least in part on performing the flip-left-to-right operation.

In some examples, the counting component 755 is capable of, configured to, or operable to support a means for calculating the first quantity of bits and the second quantity of bits based on a quantity of the total set of bits, the quantity of the first subset of bits, and a difference between the quantity of redundant sign bits for the real portion and the quantity of redundant sign bits for the imaginary portion, where encoding the second subset of bits is based on the calculating of the first quantity of bits and the second quantity of bits.

In some examples, the first subset encoder 725 is capable of, configured to, or operable to support a means for encoding an additional first subset of bits of a second total set of bits associated with a second fixed point complex data set including a second real portion and a second imaginary portion, where the additional first subset of bits indicates an additional quantity of redundant sign bits that are redundant for the second real portion and the second imaginary portion, and where a quantity of the additional first subset of bits is based on the compression encoding scheme. In some examples, the second subset encoder 730 is capable of, configured to, or operable to support a means for encoding an additional second subset of bits of the second total set of bits, where a first portion of the additional second subset of bits indicates the second real portion and a second portion of the additional second subset of bits indicates the second imaginary portion, and where an additional first quantity of bits of the first portion of the additional second subset of bits is the same as an additional second quantity of bits of the second portion of the additional second subset of bits based on the quantity of the additional first subset of bits being an even integer value in accordance with the compression encoding scheme.

Additionally, or alternatively, the communications manager 720 may support wireless communications in accordance with examples as disclosed herein. The message manager 740 is capable of, configured to, or operable to support a means for receiving a message including a total set of bits associated with encoding a fixed point complex data set that includes a real portion and an imaginary portion. The first subset decoder 745 is capable of, configured to, or operable to support a means for obtaining, based on receiving the message, a first subset of bits of the total set of bits, the first subset of bits indicating a quantity of redundant sign bits that are redundant for the real portion and the imaginary portion, where a quantity of the first subset of bits is based on a compression encoding scheme. The second subset decoder 750 is capable of, configured to, or operable to support a means for decoding a second subset of bits of the total set of bits, where a first portion of the second subset of bits indicates the real portion of the fixed point complex data set and a second portion of the second subset of bits indicates the imaginary portion of the fixed point complex data set, and where a first quantity of bits of the first portion is different from a second quantity of bits of the second portion based on the quantity of the first subset of bits being an odd integer value in accordance with the compression encoding scheme.

In some examples, the quantity of the first portion of the second subset of bits associated with the real portion is larger than the quantity of the second portion of the second subset of bits associated with the imaginary portion. In some examples, the quantity of the first portion of the second subset of bits associated with the imaginary portion is larger than the quantity of the second portion of the second subset of bits associated with the real portion.

In some examples, the counting manager 760 is capable of, configured to, or operable to support a means for counting a first quantity of redundant sign bits of the first portion of the second subset of bits and a second quantity of redundant sign bits of the second portion of the second subset of bits, where decoding the second subset of bits is based on the counting.

In some examples, the first quantity of redundant sign bits is counted sequentially beginning from a starting bit of the second subset of bits. In some examples, the second quantity of redundant sign bits is counted sequentially beginning from a last bit of the second subset of bits based on a flip-left-to-right operation performed on the second portion of the second subset of bits including the second quantity of redundant sign bits.

In some examples, the counting manager 760 is capable of, configured to, or operable to support a means for determining that the first quantity of bits of the first portion is larger than the second quantity of bits of the second portion based on the first quantity of redundant sign bits being larger than the second quantity of redundant bits, where the decoding is based on the determining. In some examples, the total set of bits includes 16 bits, the quantity of the first subset of bits includes three bits, the first quantity of bits includes seven bits, and the second quantity of bits includes six bits.

In some examples, the counting manager 760 is capable of, configured to, or operable to support a means for determining that the second quantity of bits of the second portion is larger than the first quantity of bits of the first portion based on the second quantity of redundant sign bits being larger than the first quantity of redundant bits, where the decoding is based on the determining.

In some examples, the total set of bits includes 16 bits, the quantity of the first subset of bits includes three bits, the first quantity of bits includes six bits, and the second quantity of bits includes seven bits.

Figure 8:
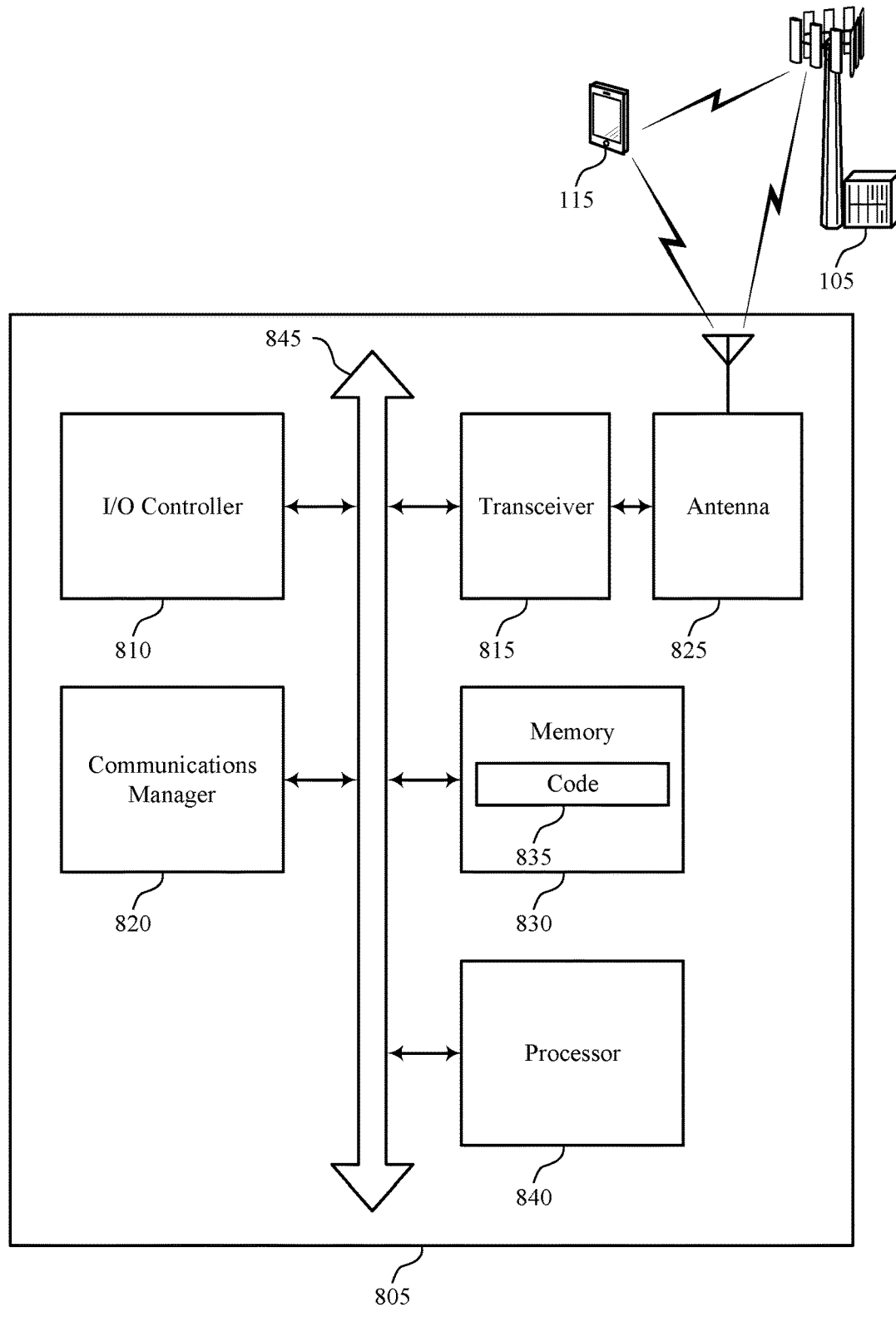
FIG. 8 shows a diagram of a system including a UE that supports asymmetric encoding schemes in accordance with one or more aspects of the present disclosure.

FIG. 8 shows a diagram of a system 800 including a device 805 that supports asymmetric encoding schemes in accordance with one or more aspects of the present disclosure. The device 805 may be an example of or include the components of a device 505, a device 605, or a UE 115 as described herein. The device 805 may communicate (e.g., wirelessly) with one or more network entities 105, one or more UEs 115, or any combination thereof. The device 805 may include components for bi-directional voice and data communications including components for transmitting and receiving communications, such as a communications manager 820, an input/output (I/O) controller 810, a transceiver 815, an antenna 825, at least one memory 830, code 835, and at least one processor 840. These components may be in electronic communication or otherwise coupled (e.g., operatively, communicatively, functionally, electronically, electrically) via one or more buses (e.g., a bus 845).

The I/O controller 810 may manage input and output signals for the device 805. The I/O controller 810 may also manage peripherals not integrated into the device 805. In some cases, the I/O controller 810 may represent a physical connection or port to an external peripheral. In some cases, the I/O controller 810 may utilize an operating system such as iOS®, ANDROID®, MS-DOS®, MS-WINDOWS®, OS/2®, UNIX®, LINUX®, or another known operating system. Additionally or alternatively, the I/O controller 810 may represent or interact with a modem, a keyboard, a mouse, a touchscreen, or a similar device. In some cases, the I/O controller 810 may be implemented as part of one or more processors, such as the at least one processor 840. In some cases, a user may interact with the device 805 via the I/O controller 810 or via hardware components controlled by the I/O controller 810.

In some cases, the device 805 may include a single antenna 825. However, in some other cases, the device 805 may have more than one antenna 825, which may be capable of concurrently transmitting or receiving multiple wireless transmissions. The transceiver 815 may communicate bi-directionally, via the one or more antennas 825, wired, or wireless links as described herein. For example, the transceiver 815 may represent a wireless transceiver and may communicate bi-directionally with another wireless transceiver. The transceiver 815 may also include a modem to modulate the packets, to provide the modulated packets to one or more antennas 825 for transmission, and to demodulate packets received from the one or more antennas 825. The transceiver 815, or the transceiver 815 and one or more antennas 825, may be an example of a transmitter 515, a transmitter 615, a receiver 510, a receiver 610, or any combination thereof or component thereof, as described herein.

The at least one memory 830 may include random access memory (RAM) and read-only memory (ROM). The at least one memory 830 may store computer-readable, computer-executable code 835 including instructions that, when executed by the at least one processor 840, cause the device 805 to perform various functions described herein. The code 835 may be stored in a non-transitory computer-readable medium such as system memory or another type of memory. In some cases, the code 835 may not be directly executable by the at least one processor 840 but may cause a computer (e.g., when compiled and executed) to perform functions described herein. In some cases, the at least one memory 830 may contain, among other things, a basic I/O system (BIOS) which may control basic hardware or software operation such as the interaction with peripheral components or devices.

The at least one processor 840 may include an intelligent hardware device (e.g., a general-purpose processor, a DSP, a CPU, a GPU, an NPU, a microcontroller, an ASIC, an FPGA, a programmable logic device, a discrete gate or transistor logic component, a discrete hardware component, or any combination thereof). In some cases, the at least one processor 840 may be configured to operate a memory array using a memory controller. In some other cases, a memory controller may be integrated into the at least one processor 840. The at least one processor 840 may be configured to execute computer-readable instructions stored in a memory (e.g., the at least one memory 830) to cause the device 805 to perform various functions (e.g., functions or tasks supporting asymmetric encoding schemes). For example, the device 805 or a component of the device 805 may include at least one processor 840 and at least one memory 830 coupled with or to the at least one processor 840, the at least one processor 840 and at least one memory 830 configured to perform various functions described herein. In some examples, the at least one processor 840 may include multiple processors and the at least one memory 830 may include multiple memories. One or more of the multiple processors may be coupled with one or more of the multiple memories, which may, individually or collectively, be configured to perform various functions herein. In some examples, the at least one processor 840 may be a component of a processing system, which may refer to a system (such as a series) of machines, circuitry (including, for example, one or both of processor circuitry (which may include the at least one processor 840) and memory circuitry (which may include the at least one memory 830)), or components, that receives or obtains inputs and processes the inputs to produce, generate, or obtain a set of outputs. The processing system may be configured to perform one or more of the functions described herein. As such, the at least one processor 840 or a processing system including the at least one processor 840 may be configured to, configurable to, or operable to cause the device 805 to perform one or more of the functions described herein. Further, as described herein, being "configured to," being "configurable to," and being "operable to" may be used interchangeably and may be associated with a capability, when executing code stored in the at least one memory 830 or otherwise, to perform one or more of the functions described herein.

The communications manager 820 may support wireless communications in accordance with examples as disclosed herein. For example, the communications manager 820 is capable of, configured to, or operable to support a means for encoding a first subset of bits of a total set of bits that are configured for encoding a fixed point complex data set that includes a real portion and an imaginary portion, where the first subset of bits indicates a quantity of redundant sign bits that are redundant for the real portion and the imaginary portion, and where a quantity of the first subset of bits is based on a compression encoding scheme. The communications manager 820 is capable of, configured to, or operable to support a means for encoding a second subset of bits of the total set of bits, where a first portion of the second subset of bits indicates the real portion of the fixed point complex data set and a second portion of the second subset of bits indicates the imaginary portion of the fixed point complex data set, and where a first quantity of bits of the first portion is different from a second quantity of bits of the second portion based on the quantity of the first subset of bits being an odd integer value in accordance with the compression encoding scheme. The communications manager 820 is capable of, configured to, or operable to support a means for transmitting a message including the total set of bits.

Additionally, or alternatively, the communications manager 820 may support wireless communications in accordance with examples as disclosed herein. For example, the communications manager 820 is capable of, configured to, or operable to support a means for receiving a message including a total set of bits associated with encoding a fixed point complex data set that includes a real portion and an imaginary portion. The communications manager 820 is capable of, configured to, or operable to support a means for obtaining, basing at least in part on receiving the message, a first subset of bits of the total set of bits, the first subset of bits indicating a quantity of redundant sign bits that are redundant for the real portion and the imaginary portion, where a quantity of the first subset of bits is based on a compression encoding scheme. The communications manager 820 is capable of, configured to, or operable to support a means for decoding a second subset of bits of the total set of bits, where a first portion of the second subset of bits indicates the real portion of the fixed point complex data set and a second portion of the second subset of bits indicates the imaginary portion of the fixed point complex data set, and where a first quantity of bits of the first portion is different from a second quantity of bits of the second portion based on the quantity of the first subset of bits being an odd integer value in accordance with the compression encoding scheme.

By including or configuring the communications manager 820 in accordance with examples as described herein, the device 805 may support techniques for asymmetric encoding schemes that may support encoding a higher quantity of redundant sign bits without increasing a total quantity of encoding bits. The asymmetric encoding schemes may benefit, for example, lower cost IoT devices, as the asymmetric encoding schemes may support a reduced memory footprint while maintaining a desired performance target for a given setpoint.

In some examples, the communications manager 820 may be configured to perform various operations (e.g., receiving, monitoring, transmitting) using or otherwise in cooperation with the transceiver 815, the one or more antennas 825, or any combination thereof. Although the communications manager 820 is illustrated as a separate component, in some examples, one or more functions described with reference to the communications manager 820 may be supported by or performed by the at least one processor 840, the at least one memory 830, the code 835, or any combination thereof. For example, the code 835 may include instructions executable by the at least one processor 840 to cause the device 805 to perform various aspects of asymmetric encoding schemes as described herein, or the at least one processor 840 and the at least one memory 830 may be otherwise configured to, individually or collectively, perform or support such operations.

Figure 9:
FIG. 9 shows a diagram of a system including a network entity that supports asymmetric encoding schemes in accordance with one or more aspects of the present disclosure.

FIG. 9 shows a diagram of a system 900 including a device 905 that supports asymmetric encoding schemes in accordance with one or more aspects of the present disclosure. The device 905 may be an example of or include the components of a device 505, a device 605, or a network entity 105 as described herein. The device 905 may communicate with one or more network entities 105, one or more UEs 115, or any combination thereof, which may include communications over one or more wired interfaces, over one or more wireless interfaces, or any combination thereof. The device 905 may include components that support outputting and obtaining communications, such as a communications manager 920, a transceiver 910, an antenna 915, at least one memory 925, code 930, and at least one processor 935. These components may be in electronic communication or otherwise coupled (e.g., operatively, communicatively, functionally, electronically, electrically) via one or more buses (e.g., a bus 940).

The transceiver 910 may support bi-directional communications via wired links, wireless links, or both as described herein. In some examples, the transceiver 910 may include a wired transceiver and may communicate bi-directionally with another wired transceiver. Additionally, or alternatively, in some examples, the transceiver 910 may include a wireless transceiver and may communicate bi-directionally with another wireless transceiver. In some examples, the device 905 may include one or more antennas 915, which may be capable of transmitting or receiving wireless transmissions (e.g., concurrently). The transceiver 910 may also include a modem to modulate signals, to provide the modulated signals for transmission (e.g., by one or more antennas 915, by a wired transmitter), to receive modulated signals (e.g., from one or more antennas 915, from a wired receiver), and to demodulate signals. In some implementations, the transceiver 910 may include one or more interfaces, such as one or more interfaces coupled with the one or more antennas 915 that are configured to support various receiving or obtaining operations, or one or more interfaces coupled with the one or more antennas 915 that are configured to support various transmitting or outputting operations, or a combination thereof. In some implementations, the transceiver 910 may include or be configured for coupling with one or more processors or one or more memory components that are operable to perform or support operations based on received or obtained information or signals, or to generate information or other signals for transmission or other outputting, or any combination thereof. In some implementations, the transceiver 910, or the transceiver 910 and the one or more antennas 915, or the transceiver 910 and the one or more antennas 915 and one or more processors or one or more memory components (e.g., the at least one processor 935, the at least one memory 925, or both), may be included in a chip or chip assembly that is installed in the device 905. In some examples, the transceiver 910 may be operable to support communications via one or more communications links (e.g., a communication link 125, a backhaul communication link 120, a midhaul communication link 162, a fronthaul communication link 168).

The at least one memory 925 may include RAM, ROM, or any combination thereof. The at least one memory 925 may store computer-readable, computer-executable code 930 including instructions that, when executed by one or more of the at least one processor 935, cause the device 905 to perform various functions described herein. The code 930 may be stored in a non-transitory computer-readable medium such as system memory or another type of memory. In some cases, the code 930 may not be directly executable by a processor of the at least one processor 935 but may cause a computer (e.g., when compiled and executed) to perform functions described herein. In some cases, the at least one memory 925 may contain, among other things, a BIOS which may control basic hardware or software operation such as the interaction with peripheral components or devices. In some examples, the at least one processor 935 may include multiple processors and the at least one memory 925 may include multiple memories. One or more of the multiple processors may be coupled with one or more of the multiple memories which may, individually or collectively, be configured to perform various functions herein (for example, as part of a processing system).

The at least one processor 935 may include an intelligent hardware device (e.g., a general-purpose processor, a DSP, an ASIC, a CPU, a GPU, an NPU, an FPGA, a microcontroller, a programmable logic device, discrete gate or transistor logic, a discrete hardware component, or any combination thereof). In some cases, the at least one processor 935 may be configured to operate a memory array using a memory controller. In some other cases, a memory controller may be integrated into one or more of the at least one processor 935. The at least one processor 935 may be configured to execute computer-readable instructions stored in a memory (e.g., one or more of the at least one memory 925) to cause the device 905 to perform various functions (e.g., functions or tasks supporting asymmetric encoding schemes). For example, the device 905 or a component of the device 905 may include at least one processor 935 and at least one memory 925 coupled with one or more of the at least one processor 935, the at least one processor 935 and the at least one memory 925 configured to perform various functions described herein. The at least one processor 935 may be an example of a cloud-computing platform (e.g., one or more physical nodes and supporting software such as operating systems, virtual machines, or container instances) that may host the functions (e.g., by executing code 930) to perform the functions of the device 905. The at least one processor 935 may be any one or more suitable processors capable of executing scripts or instructions of one or more software programs stored in the device 905 (such as within one or more of the at least one memory 925). In some examples, the at least one processor 935 may include multiple processors and the at least one memory 925 may include multiple memories. One or more of the multiple processors may be coupled with one or more of the multiple memories, which may, individually or collectively, be configured to perform various functions herein. In some examples, the at least one processor 935 may be a component of a processing system, which may refer to a system (such as a series) of machines, circuitry (including, for example, one or both of processor circuitry (which may include the at least one processor 935) and memory circuitry (which may include the at least one memory 925)), or components, that receives or obtains inputs and processes the inputs to produce, generate, or obtain a set of outputs. The processing system may be configured to perform one or more of the functions described herein. As such, the at least one processor 935 or a processing system including the at least one processor 935 may be configured to, configurable to, or operable to cause the device 905 to perform one or more of the functions described herein. Further, as described herein, being "configured to," being "configurable to," and being "operable to" may be used interchangeably and may be associated with a capability, when executing code stored in the at least one memory 925 or otherwise, to perform one or more of the functions described herein.

In some examples, a bus 940 may support communications of (e.g., within) a protocol layer of a protocol stack. In some examples, a bus 940 may support communications associated with a logical channel of a protocol stack (e.g., between protocol layers of a protocol stack), which may include communications performed within a component of the device 905, or between different components of the device 905 that may be co-located or located in different locations (e.g., where the device 905 may refer to a system in which one or more of the communications manager 920, the transceiver 910, the at least one memory 925, the code 930, and the at least one processor 935 may be located in one of the different components or divided between different components).

In some examples, the communications manager 920 may manage aspects of communications with a core network 130 (e.g., via one or more wired or wireless backhaul links). For example, the communications manager 920 may manage the transfer of data communications for client devices, such as one or more UEs 115. In some examples, the communications manager 920 may manage communications with other network entities 105, and may include a controller or scheduler for controlling communications with UEs 115 in cooperation with other network entities 105. In some examples, the communications manager 920 may support an X2 interface within an LTE/LTE-A wireless communications network technology to provide communication between network entities 105.

The communications manager 920 may support wireless communications in accordance with examples as disclosed herein. For example, the communications manager 920 is capable of, configured to, or operable to support a means for encoding a first subset of bits of a total set of bits that are configured for encoding a fixed point complex data set that includes a real portion and an imaginary portion, where the first subset of bits indicates a quantity of redundant sign bits that are redundant for the real portion and the imaginary portion, and where a quantity of the first subset of bits is based on a compression encoding scheme. The communications manager 920 is capable of, configured to, or operable to support a means for encoding a second subset of bits of the total set of bits, where a first portion of the second subset of bits indicates the real portion of the fixed point complex data set and a second portion of the second subset of bits indicates the imaginary portion of the fixed point complex data set, and where a first quantity of bits of the first portion is different from a second quantity of bits of the second portion based on the quantity of the first subset of bits being an odd integer value in accordance with the compression encoding scheme. The communications manager 920 is capable of, configured to, or operable to support a means for transmitting a message including the total set of bits.

Additionally, or alternatively, the communications manager 920 may support wireless communications in accordance with examples as disclosed herein. For example, the communications manager 920 is capable of, configured to, or operable to support a means for receiving a message including a total set of bits associated with encoding a fixed point complex data set that includes a real portion and an imaginary portion. The communications manager 920 is capable of, configured to, or operable to support a means for obtaining, basing at least in part on receiving the message, a first subset of bits of the total set of bits, the first subset of bits indicating a quantity of redundant sign bits that are redundant for the real portion and the imaginary portion, where a quantity of the first subset of bits is based on a compression encoding scheme. The communications manager 920 is capable of, configured to, or operable to support a means for decoding a second subset of bits of the total set of bits, where a first portion of the second subset of bits indicates the real portion of the fixed point complex data set and a second portion of the second subset of bits indicates the imaginary portion of the fixed point complex data set, and where a first quantity of bits of the first portion is different from a second quantity of bits of the second portion based on the quantity of the first subset of bits being an odd integer value in accordance with the compression encoding scheme.

By including or configuring the communications manager 920 in accordance with examples as described herein, the device 905 may support techniques for asymmetric encoding schemes that may support encoding a higher quantity of redundant sign bits without increasing a total quantity of encoding bits. The asymmetric encoding schemes may benefit, for example, lower cost IoT devices, as the asymmetric encoding schemes may support a reduced memory footprint while maintaining a desired performance target for a given setpoint.

In some examples, the communications manager 920 may be configured to perform various operations (e.g., receiving, obtaining, monitoring, outputting, transmitting) using or otherwise in cooperation with the transceiver 910, the one or more antennas 915 (e.g., where applicable), or any combination thereof. Although the communications manager 920 is illustrated as a separate component, in some examples, one or more functions described with reference to the communications manager 920 may be supported by or performed by the transceiver 910, one or more of the at least one processor 935, one or more of the at least one memory 925, the code 930, or any combination thereof (for example, by a processing system including at least a portion of the at least one processor 935, the at least one memory 925, the code 930, or any combination thereof). For example, the code 930 may include instructions executable by one or more of the at least one processor 935 to cause the device 905 to perform various aspects of asymmetric encoding schemes as described herein, or the at least one processor 935 and the at least one memory 925 may be otherwise configured to, individually or collectively, perform or support such operations.

FIG. 10 shows a flowchart illustrating a method 1000 that supports asymmetric encoding schemes in accordance with aspects of the present disclosure. The operations of the method 1000 may be implemented by a UE or a network entity or its components as described herein. For example, the operations of the method 1000 may be performed by a UE 115 or a network entity as described with reference to FIGS. 1 through 9. In some examples, a UE or a network entity may execute a set of instructions to control the functional elements of the UE or the network entity to perform the described functions. Additionally, or alternatively, the UE or the network entity may perform aspects of the described functions using special-purpose hardware.

At 1005, the method may comprise encoding a first subset of bits of a total set of bits that are configured for encoding a fixed point complex data set that comprises a real portion and an imaginary portion, wherein the first subset of bits indicates a quantity of redundant sign bits that are redundant for the real portion and the imaginary portion, and wherein a quantity of the first subset of bits is based at least in part on a compression encoding scheme. The operations of block 1005 may be performed in accordance with examples as disclosed herein. In some examples, aspects of the operations of 1005 may be performed by a first subset encoder 725 as described with reference to FIG. 7.

At 1010, the method may comprise encoding a second subset of bits of the total set of bits, wherein a first portion of the second subset of bits indicates the real portion of the fixed point complex data set and a second portion of the second subset of bits indicates the imaginary portion of the fixed point complex data set, and wherein a first quantity of bits of the first portion is different from a second quantity of bits of the second portion based at least in part on the quantity of the first subset of bits being an odd integer value in accordance with the compression encoding scheme. The operations of block 1010 may be performed in accordance with examples as disclosed herein. In some examples, aspects of the operations of 1010 may be performed by a second subset encoder 730 as described with reference to FIG. 7.

At 1015, the method may comprise transmitting a message comprising the total set of bits. The operations of block 1015 may be performed in accordance with examples as disclosed herein. In some examples, aspects of the operations of 1015 may be performed by a message component 735 as described with reference to FIG. 7.

FIG. 11 shows a flowchart illustrating a method 1100 that supports asymmetric encoding schemes in accordance with aspects of the present disclosure. The operations of the method 1100 may be implemented by a UE or a network entity or its components as described herein. For example, the operations of the method 1100 may be performed by a UE 115 or a network entity as described with reference to FIGS. 1 through 9. In some examples, a UE or a network entity may execute a set of instructions to control the functional elements of the UE or the network entity to perform the described functions. Additionally, or alternatively, the UE or the network entity may perform aspects of the described functions using special-purpose hardware.

At 1105, the method may comprise encoding a first subset of bits of a total set of bits that are configured for encoding a fixed point complex data set that comprises a real portion and an imaginary portion, wherein the first subset of bits indicates a quantity of redundant sign bits that are redundant for the real portion and the imaginary portion, and wherein a quantity of the first subset of bits is based at least in part on a compression encoding scheme. The operations of block 1105 may be performed in accordance with examples as disclosed herein. In some examples, aspects of the operations of 1105 may be performed by a first subset encoder 725 as described with reference to FIG. 7.

At 1110, the method may comprise counting a quantity of redundant sign bits for the real portion and a quantity of redundant sign bits for the imaginary portion, wherein encoding the second subset of bits is based at least in part on the counting. The operations of block 1110 may be performed in accordance with examples as disclosed herein. In some examples, aspects of the operations of 1110 may be performed by a counting component 755 as described with reference to FIG. 7.

At 1115, the method may comprise encoding a second subset of bits of the total set of bits, wherein a first portion of the second subset of bits indicates the real portion of the fixed point complex data set and a second portion of the second subset of bits indicates the imaginary portion of the fixed point complex data set, and wherein a first quantity of bits of the first portion is different from a second quantity of bits of the second portion based at least in part on the quantity of the first subset of bits being an odd integer value in accordance with the compression encoding scheme. The operations of block 1115 may be performed in accordance with examples as disclosed herein. In some examples, aspects of the operations of 1115 may be performed by a second subset encoder 730 as described with reference to FIG. 7.

At 1120, the method may comprise transmitting a message comprising the total set of bits. The operations of block 1120 may be performed in accordance with examples as disclosed herein. In some examples, aspects of the operations of 1120 may be performed by a message component 735 as described with reference to FIG. 7.

FIG. 12 shows a flowchart illustrating a method 1200 that supports asymmetric encoding schemes in accordance with aspects of the present disclosure. The operations of the method 1200 may be implemented by a UE or a network entity or its components as described herein. For example, the operations of the method 1200 may be performed by a UE 115 or a network entity as described with reference to FIGS. 1 through 9. In some examples, a UE or a network entity may execute a set of instructions to control the functional elements of the UE or the network entity to perform the described functions. Additionally, or alternatively, the UE or the network entity may perform aspects of the described functions using special-purpose hardware.

At 1205, the method may comprise receiving a message comprising a total set of bits associated with encoding a fixed point complex data set that comprises a real portion and an imaginary portion. The operations of block 1205 may be performed in accordance with examples as disclosed herein. In some examples, aspects of the operations of 1205 may be performed by a message manager 740 as described with reference to FIG. 7.

At 1210, the method may comprise obtaining, based at least in part on receiving the message, a first subset of bits of the total set of bits, the first subset of bits indicating a quantity of redundant sign bits that are redundant for the real portion and the imaginary portion, wherein a quantity of the first subset of bits is based at least in part on a compression encoding scheme. The operations of block 1210 may be performed in accordance with examples as disclosed herein. In some examples, aspects of the operations of 1210 may be performed by a first subset decoder 745 as described with reference to FIG. 7.

At 1215, the method may comprise decoding a second subset of bits of the total set of bits, wherein a first portion of the second subset of bits indicates the real portion of the fixed point complex data set and a second portion of the second subset of bits indicates the imaginary portion of the fixed point complex data set, and wherein a first quantity of bits of the first portion is different from a second quantity of bits of the second portion based at least in part on the quantity of the first subset of bits being an odd integer value in accordance with the compression encoding scheme. The operations of block 1215 may be performed in accordance with examples as disclosed herein. In some examples, aspects of the operations of 1215 may be performed by a second subset decoder 750 as described with reference to FIG. 7.

FIG. 13 shows a flowchart illustrating a method 1300 that supports asymmetric encoding schemes in accordance with aspects of the present disclosure. The operations of the method 1300 may be implemented by a UE or a network entity or its components as described herein. For example, the operations of the method 1300 may be performed by a UE 115 or a network entity as described with reference to FIGS. 1 through 9. In some examples, a UE or a network entity may execute a set of instructions to control the functional elements of the UE or the network entity to perform the described functions. Additionally, or alternatively, the UE or the network entity may perform aspects of the described functions using special-purpose hardware.

At 1305, the method may comprise receiving a message comprising a total set of bits associated with encoding a fixed point complex data set that comprises a real portion and an imaginary portion. The operations of block 1305 may be performed in accordance with examples as disclosed herein. In some examples, aspects of the operations of 1305 may be performed by a message manager 740 as described with reference to FIG. 7.

At 1310, the method may comprise obtaining, based at least in part on receiving the message, a first subset of bits of the total set of bits, the first subset of bits indicating a quantity of redundant sign bits that are redundant for the real portion and the imaginary portion, wherein a quantity of the first subset of bits is based at least in part on a compression encoding scheme. The operations of block 1310 may be performed in accordance with examples as disclosed herein. In some examples, aspects of the operations of 1310 may be performed by a first subset decoder 745 as described with reference to FIG. 7.

At 1315, the method may comprise counting a first quantity of redundant sign bits of the first portion of the second subset of bits and a second quantity of redundant sign bits of the second portion of the second subset of bits. The operations of block 1315 may be performed in accordance with examples as disclosed herein. In some examples, aspects of the operations of 1315 may be performed by a counting manager 760 as described with reference to FIG. 7.

At 1320, the method may comprise decoding, based at least in part on counting the first quantity of redundant sign bits, a second subset of bits of the total set of bits, wherein a first portion of the second subset of bits indicates the real portion of the fixed point complex data set and a second portion of the second subset of bits indicates the imaginary portion of the fixed point complex data set, and wherein a first quantity of bits of the first portion is different from a second quantity of bits of the second portion based at least in part on the quantity of the first subset of bits being an odd integer value in accordance with the compression encoding scheme. The operations of block 1320 may be performed in accordance with examples as disclosed herein. In some examples, aspects of the operations of 1320 may be performed by a second subset decoder 750 as described with reference to FIG. 7.

The following provides an overview of aspects of the present disclosure:

Aspect 1: A method for wireless communications at a transmitting device, comprising: encoding a first subset of bits of a total set of bits that are configured for encoding a fixed point complex data set that comprises a real portion and an imaginary portion, wherein the first subset of bits indicates a quantity of redundant sign bits that are redundant for the real portion and the imaginary portion, and wherein a quantity of the first subset of bits is based at least in part on a compression encoding scheme; encoding a second subset of bits of the total set of bits, wherein a first portion of the second subset of bits indicates the real portion of the fixed point complex data set and a second portion of the second subset of bits indicates the imaginary portion of the fixed point complex data set, and wherein a first quantity of bits of the first portion is different from a second quantity of bits of the second portion based at least in part on the quantity of the first subset of bits being an odd integer value in accordance with the compression encoding scheme; and transmitting a message comprising the total set of bits.

Aspect 2: The method of aspect 1, wherein the quantity of the first portion of the second subset of bits associated with the real portion is larger than the quantity of the second portion of the second subset of bits associated with the imaginary portion.

Aspect 3: The method of aspect 1, wherein the quantity of the first portion of the second subset of bits associated with the imaginary portion is larger than the quantity of the second portion of the second subset of bits associated with the real portion.

Aspect 4: The method of any of aspects 1 through 3, further comprising: counting a quantity of redundant sign bits for the real portion and a quantity of redundant sign bits for the imaginary portion, wherein encoding the second subset of bits is based at least in part on the counting.

Aspect 5: The method of aspect 4, further comprising: encoding the first portion of the second subset of bits having the first quantity of bits, wherein the first quantity of bits of the first portion is larger than the second quantity of bits of the second portion based at least in part on the quantity of redundant sign bits for the real portion being larger than the quantity of redundant sign bits for the imaginary portion.

Aspect 6: The method of aspect 5, wherein the total set of bits comprises 16 bits, the quantity of the first subset of bits comprises three bits, the first quantity of bits comprises seven bits, and the second quantity of bits comprises six bits.

Aspect 7: The method of any of aspect 4, further comprising: encoding the second portion of the second subset of bits having the second quantity of bits, wherein the second quantity of bits of the second portion is larger than the first quantity of bits of the first portion based at least in part on the quantity of redundant sign bits for the imaginary portion being larger than the quantity of redundant sign bits for the real portion.

Aspect 8: The method of aspect 7, wherein the total set of bits comprises 16 bits, the quantity of the first subset of bits comprises three bits, the first quantity of bits comprises six bits, and the second quantity of bits comprises seven bits.

Aspect 9: The method of any of aspects 4 through 8, further comprising: calculating the first quantity of bits and the second quantity of bits based at least in part on a quantity of the total set of bits, the quantity of the first subset of bits, and a difference between the quantity of redundant sign bits for the real portion and the quantity of redundant sign bits for the imaginary portion, wherein encoding the second subset of bits is based at least in part on the calculating of the first quantity of bits and the second quantity of bits.

Aspect 10: The method of any of aspects 1 through 9, further comprising: performing a flip-left-to-right operation on the second portion of the second subset of bits, wherein encoding the second subset of bits is based at least in part on performing the flip-left-to-right operation.

Aspect 11: The method of any of aspects 1 through 10, further comprising: encoding an additional first subset of bits of a second total set of bits associated with a second fixed point complex data set comprising a second real portion and a second imaginary portion, wherein the additional first subset of bits indicates an additional quantity of redundant sign bits that are redundant for the second real portion and the second imaginary portion, and wherein a quantity of the additional first subset of bits is based at least in part on the compression encoding scheme; and encoding an additional second subset of bits of the second total set of bits, wherein a first portion of the additional second subset of bits indicates the second real portion and a second portion of the additional second subset of bits indicates the second imaginary portion, and wherein an additional first quantity of bits of the first portion of the additional second subset of bits is the same as an additional second quantity of bits of the second portion of the additional second subset of bits based at least in part on the quantity of the additional first subset of bits being an even integer value in accordance with the compression encoding scheme.

Aspect 12: A method for wireless communications at a receiving device, comprising: receiving a message comprising a total set of bits associated with encoding a fixed point complex data set that comprises a real portion and an imaginary portion; obtaining, based at least in part on receiving the message, a first subset of bits of the total set of bits, the first subset of bits indicating a quantity of redundant sign bits that are redundant for the real portion and the imaginary portion, wherein a quantity of the first subset of bits is based at least in part on a compression encoding scheme; and decoding a second subset of bits of the total set of bits, wherein a first portion of the second subset of bits indicates the real portion of the fixed point complex data set and a second portion of the second subset of bits indicates the imaginary portion of the fixed point complex data set, and wherein a first quantity of bits of the first portion is different from a second quantity of bits of the second portion based at least in part on the quantity of the first subset of bits being an odd integer value in accordance with the compression encoding scheme.

Aspect 13: The method of aspect 12, wherein the quantity of the first portion of the second subset of bits associated with the real portion is larger than the quantity of the second portion of the second subset of bits associated with the imaginary portion.

Aspect 14: The method of any of aspect 12, wherein the quantity of the first portion of the second subset of bits associated with the imaginary portion is larger than the quantity of the second portion of the second subset of bits associated with the real portion.

Aspect 15: The method of any of aspects 12 through 14, further comprising: counting a first quantity of redundant sign bits of the first portion of the second subset of bits and a second quantity of redundant sign bits of the second portion of the second subset of bits, wherein decoding the second subset of bits is based at least in part on the counting.

Aspect 16: The method of aspect 15, wherein the first quantity of redundant sign bits is counted sequentially beginning from a starting bit of the second subset of bits, and the second quantity of redundant sign bits is counted sequentially beginning from a last bit of the second subset of bits based at least in part on a flip-left-to-right operation performed on the second quantity of redundant sign bits.

Aspect 17: The method of any of aspects 15 through 16, further comprising: determining that the first quantity of bits of the first portion is larger than the second quantity of bits of the second portion based at least in part on the first quantity of redundant sign bits being larger than the second quantity of redundant bits, wherein the decoding is based at least in part on the determining.

Aspect 18: The method of aspect 17, wherein the total set of bits comprises 16 bits, the quantity of the first subset of bits comprises three bits, the first quantity of bits comprises seven bits, and the second quantity of bits comprises six bits.

Aspect 19: The method of any of aspects 15 through 16, further comprising: determining that the second quantity of bits of the second portion is larger than the first quantity of bits of the first portion based at least in part on the second quantity of redundant sign bits being larger than the first quantity of redundant bits, wherein the decoding is based at least in part on the determining.

Aspect 20: The method of aspect 19, wherein the total set of bits comprises 16 bits, the quantity of the first subset of bits comprises three bits, the first quantity of bits comprises six bits, and the second quantity of bits comprises seven bits.

Aspect 21: A transmitting device for wireless communications, comprising one or more memories storing processor-executable code, and one or more processors coupled with the one or more memories and individually or collectively operable to execute the code to cause the transmitting device to perform a method of any of aspects 1 through 11.

Aspect 22: A transmitting device for wireless communications, comprising at least one means for performing a method of any of aspects 1 through 11.

Aspect 23: A non-transitory computer-readable medium storing code for wireless communications, the code comprising instructions executable by one or more processors (e.g., directly, indirectly, after pre-processing, without pre-processing, individually, collectively) to perform a method of any of aspects 1 through 11.

Aspect 24: A receiving device for wireless communications, comprising one or more memories storing processor-executable code, and one or more processors coupled with the one or more memories and individually or collectively operable to execute the code to cause the receiving device to perform a method of any of aspects 12 through 20.

Aspect 25: A receiving device for wireless communications, comprising at least one means for performing a method of any of aspects 12 through 20.

Aspect 26: A non-transitory computer-readable medium storing code for wireless communications, the code comprising instructions executable by one or more processors (e.g., directly, indirectly, after pre-processing, without pre-processing, individually, collectively) to perform a method of any of aspects 12 through 20.

It should be noted that the methods described herein describe possible implementations, and that the operations and the steps may be rearranged or otherwise modified and that other implementations are possible. Further, aspects from two or more of the methods may be combined.

Although aspects of an LTE, LTE-A, LTE-A Pro, or NR system may be described for purposes of example, and LTE, LTE-A, LTE-A Pro, or NR terminology may be used in much of the description, the techniques described herein are applicable beyond LTE, LTE-A, LTE-A Pro, or NR networks. For example, the described techniques may be applicable to various other wireless communications systems such as Ultra Mobile Broadband (UMB), Institute of Electrical and Electronics Engineers (IEEE) 802.11 (Wi-Fi), IEEE 802.16 (WiMAX), IEEE 802.20, Flash-OFDM, as well as other systems and radio technologies, including future systems and radio technologies, not explicitly mentioned herein. Components within a wireless communication system may be coupled (for example, operatively, communicatively, functionally, electronically, and/or electrically) to each other.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof.

The various illustrative blocks and components described in connection with the disclosure herein may be implemented or performed using a general-purpose processor, a DSP, an ASIC, a CPU, a GPU, an NPU, an FPGA or other programmable logic device, discrete gate or transistor logic, discrete hardware components, or any combination thereof designed to perform the functions described herein. A general-purpose processor may be a microprocessor but, in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration). Any functions or operations described herein as being capable of being performed by a processor may be performed by multiple processors that, individually or collectively, are capable of performing the described functions or operations.

The functions described herein may be implemented using hardware, software executed by a processor, or any combination thereof. Software shall be construed broadly to mean instructions, instruction sets, code, code segments, program code, programs, subprograms, software modules, applications, software applications, software packages, routines, subroutines, objects, executables, threads of execution, procedures, or functions, whether referred to as software, middleware, microcode, hardware description language, or otherwise. If implemented using software executed by a processor, the functions may be stored as or transmitted using one or more instructions or code of a computer-readable medium. Other examples and implementations are within the scope of the disclosure and appended claims. For example, due to the nature of software, functions described herein may be implemented using software executed by a processor, hardware, hardwiring, or combinations of any of these. Features implementing functions may also be physically located at various positions, including being distributed such that portions of functions are implemented at different physical locations.

Computer-readable media includes both non-transitory computer storage media and communication media including any medium that facilitates transfer of a computer program from one location to another. A non-transitory storage medium may be any available medium that may be accessed by a general-purpose or special-purpose computer. By way of example, and not limitation, non-transitory computer-readable media may include RAM, ROM, electrically erasable programmable ROM (EEPROM), flash memory, phase-change memory, compact disk (CD) ROM or other optical disk storage, magnetic disk storage or other magnetic storage devices, or any other non-transitory medium that may be used to carry or store desired program code means in the form of instructions or data structures and that may be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of computer-readable medium. Disk and disc, as used herein, include CD, laser disc, optical disc, digital versatile disc (DVD), floppy disk and Blu-ray disc. Disks may reproduce data magnetically, and discs may reproduce data optically using lasers. Combinations of the above are also included within the scope of computer-readable media. Any functions or operations described herein as being capable of being performed by a memory may be performed by multiple memories that, individually or collectively, are capable of performing the described functions or operations.

As used herein, including in the claims, "or" as used in a list of items (e.g., including a list of items prefaced by a phrase such as "at least one of" or "one or more of") indicates an inclusive list such that, for example, a list of at least one of A, B, or C means, e.g., A or B or C or AB or AC or BC or ABC (i.e., A and B and C). Also, as used herein, the phrase "based on" shall not be construed as a reference to a closed set of conditions. For example, an example step that is described as "based on condition A" may be based on both a condition A and a condition B without departing from the scope of the present disclosure. In other words, as used herein, the phrase "based on" shall be construed in the same manner as the phrase "based at least in part on." As used herein, the term "and/or," when used in a list of two or more items, means that any one of the listed items can be employed by itself, or any combination of two or more of the listed items can be employed. For example, if a composition is described as containing components A, B, and/or C, the composition can contain A alone; B alone; C alone; A and B in combination; A and C in combination; B and C in combination; or A, B, and C in combination.

As used herein, including in the claims, the article "a" before a noun is open-ended and understood to refer to "at least one" of those nouns or "one or more" of those nouns. Thus, the terms "a," "at least one," "one or more," "at least one of one or more" may be interchangeable. For example, if a claim recites "a component" that performs one or more functions, each of the individual functions may be performed by a single component or by any combination of multiple components. Thus, the term "a component" having characteristics or performing functions may refer to "at least one of one or more components" having a particular characteristic or performing a particular function. Subsequent reference to a component introduced with the article "a" using the terms "the" or "said" may refer to any or all of the one or more components. For example, a component introduced with the article "a" may be understood to mean "one or more components," and referring to "the component" subsequently in the claims may be understood to be equivalent to referring to "at least one of the one or more components." Similarly, subsequent reference to a component introduced as "one or more components" using the terms "the" or "said" may refer to any or all of the one or more components. For example, referring to "the one or more components" subsequently in the claims may be understood to be equivalent to referring to "at least one of the one or more components."

The term "determine" or "determining" or "identify" or "identifying" encompasses a variety of actions and, therefore, "determining" or "identifying" can include calculating, computing, processing, deriving, investigating, looking up (such as via looking up in a table, a database or another data structure), ascertaining and the like. Also, "determining" or "identifying" can include receiving (such as receiving information or signaling, e.g., receiving information or signaling for determining, receiving information or signaling for identifying), accessing (such as accessing data in a memory, or accessing information) and the like. Also, "determining" or "identifying" can include resolving, obtaining, selecting, choosing, establishing and other such similar actions.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label, or other subsequent reference label.

The description set forth herein, in connection with the appended drawings, describes example configurations and does not represent all the examples that may be implemented or that are within the scope of the claims. The term "example" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, known structures and devices are shown in block diagram form in order to avoid obscuring the concepts of the described examples.

The description herein is provided to enable a person having ordinary skill in the art to make or use the disclosure. Various modifications to the disclosure will be apparent to a person having ordinary skill in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A transmitting device, comprising:

one or more memories storing processor-executable code; and one or more processors coupled with the one or more memories and individually or collectively operable to execute the code to cause the transmitting device to:

encode a first subset of bits of a total set of bits that are configured for encoding a fixed point complex data set that comprises a real portion and an imaginary portion, wherein the first subset of bits indicates a quantity of redundant sign bits that are redundant for the real portion and the imaginary portion, and wherein a quantity of the first subset of bits is based at least in part on a compression encoding scheme;

encode a second subset of bits of the total set of bits, wherein a first portion of the second subset of bits indicates the real portion of the fixed point complex data set and a second portion of the second subset of bits indicates the imaginary portion of the fixed point complex data set, and wherein a first quantity of bits of the first portion is different from a second quantity of bits of the second portion based at least in part on the quantity of the first subset of bits being an odd integer value in accordance with the compression encoding scheme; and transmit a message comprising the total set of bits.

2. The transmitting device of claim 1, wherein the quantity of the first portion of the second subset of bits associated with the real portion is larger than the quantity of the second portion of the second subset of bits associated with the imaginary portion.

3. The transmitting device of claim 1, wherein the quantity of the first portion of the second subset of bits associated with the imaginary portion is larger than the quantity of the second portion of the second subset of bits associated with the real portion.

4. The transmitting device of claim 1, wherein the one or more processors are individually or collectively further operable to execute the code to cause the transmitting device to:

count a quantity of redundant sign bits for the real portion and a quantity of redundant sign bits for the imaginary portion, wherein encoding the second subset of bits is based at least in part on the counting.

5. The transmitting device of claim 4, wherein the one or more processors are individually or collectively further operable to execute the code to cause the transmitting device to:

encode the first portion of the second subset of bits having the first quantity of bits, wherein the first quantity of bits of the first portion is larger than the second quantity of bits of the second portion based at least in part on the quantity of redundant sign bits for the real portion being larger than the quantity of redundant sign bits for the imaginary portion.

6. The transmitting device of claim 5, wherein the total set of bits comprises 16 bits, the quantity of the first subset of bits comprises three bits, the first quantity of bits comprises seven bits, and the second quantity of bits comprises six bits.

7. The transmitting device of claim 4, wherein the one or more processors are individually or collectively further operable to execute the code to cause the transmitting device to:

encode the second portion of the second subset of bits having the second quantity of bits, wherein the second quantity of bits of the second portion is larger than the first quantity of bits of the first portion based at least in part on the quantity of redundant sign bits for the imaginary portion being larger than the quantity of redundant sign bits for the real portion.

8. The transmitting device of claim 7, wherein the total set of bits comprises 16 bits, the quantity of the first subset of bits comprises three bits, the first quantity of bits comprises six bits, and the second quantity of bits comprises seven bits.

9. The transmitting device of claim 4, wherein the one or more processors are individually or collectively further operable to execute the code to cause the transmitting device to:

calculate the first quantity of bits and the second quantity of bits based at least in part on a quantity of the total set of bits, the quantity of the first subset of bits, and a difference between the quantity of redundant sign bits for the real portion and the quantity of redundant sign bits for the imaginary portion, wherein encoding the second subset of bits is based at least in part on the calculating of the first quantity of bits and the second quantity of bits.

10. The transmitting device of claim 1, wherein the one or more processors are individually or collectively further operable to execute the code to cause the transmitting device to:

perform a flip-left-to-right operation on the second portion of the second subset of bits, wherein encoding the second subset of bits is based at least in part on performing the flip-left-to-right operation.

11. The transmitting device of claim 1, wherein the one or more processors are individually or collectively further operable to execute the code to cause the transmitting device to:

encode an additional first subset of bits of a second total set of bits associated with a second fixed point complex data set comprising a second real portion and a second imaginary portion, wherein the additional first subset of bits indicates an additional quantity of redundant sign bits that are redundant for the second real portion and the second imaginary portion, and wherein a quantity of the additional first subset of bits is based at least in part on the compression encoding scheme; and encode an additional second subset of bits of the second total set of bits, wherein a first portion of the additional second subset of bits indicates the second real portion and a second portion of the additional second subset of bits indicates the second imaginary portion, and wherein an additional first quantity of bits of the first portion of the additional second subset of bits is the same as an additional second quantity of bits of the second portion of the additional second subset of bits based at least in part on the quantity of the additional first subset of bits being an even integer value in accordance with the compression encoding scheme.

12. A method for wireless communications at a transmitting device, comprising:

encoding a first subset of bits of a total set of bits that are configured for encoding a fixed point complex data set that comprises a real portion and an imaginary portion, wherein the first subset of bits indicates a quantity of redundant sign bits that are redundant for the real portion and the imaginary portion, and wherein a quantity of the first subset of bits is based at least in part on a compression encoding scheme;

encoding a second subset of bits of the total set of bits, wherein a first portion of the second subset of bits indicates the real portion of the fixed point complex data set and a second portion of the second subset of bits indicates the imaginary portion of the fixed point complex data set, and wherein a first quantity of bits of the first portion is different from a second quantity of bits of the second portion based at least in part on the quantity of the first subset of bits being an odd integer value in accordance with the compression encoding scheme; and transmitting a message comprising the total set of bits.

13. The method of claim 12, wherein the quantity of the first portion of the second subset of bits associated with the real portion is larger than the quantity of the second portion of the second subset of bits associated with the imaginary portion.

14. The method of claim 12, wherein the quantity of the first portion of the second subset of bits associated with the imaginary portion is larger than the quantity of the second portion of the second subset of bits associated with the real portion.

15. The method of claim 12, further comprising:

counting a quantity of redundant sign bits for the real portion and a quantity of redundant sign bits for the imaginary portion, wherein encoding the second subset of bits is based at least in part on the counting.

16. The method of claim 15, further comprising:

encoding the first portion of the second subset of bits having the first quantity of bits, wherein the first quantity of bits of the first portion is larger than the second quantity of bits of the second portion based at least in part on the quantity of redundant sign bits for the real portion being larger than the quantity of redundant sign bits for the imaginary portion.

17. The method of claim 15, further comprising:

encoding the second portion of the second subset of bits having the second quantity of bits, wherein the second quantity of bits of the second portion is larger than the first quantity of bits of the first portion based at least in part on the quantity of redundant sign bits for the imaginary portion being larger than the quantity of redundant sign bits for the real portion.

18. The method of claim 15, further comprising:

calculating the first quantity of bits and the second quantity of bits based at least in part on a quantity of the total set of bits, the quantity of the first subset of bits, and a difference between the quantity of redundant sign bits for the real portion and the quantity of redundant sign bits for the imaginary portion, wherein encoding the second subset of bits is based at least in part on the calculating of the first quantity of bits and the second quantity of bits.

\* \* \* \* \*